(12) United States Patent
Hatanaka et al.

(10) Patent No.: US 8,125,788 B2
(45) Date of Patent: Feb. 28, 2012

(54) CIRCUIT MODULE AND RADIO COMMUNICATIONS EQUIPMENT, AND METHOD FOR MANUFACTURING CIRCUIT MODULE

(75) Inventors: Hidefumi Hatanaka, Kirishima (JP); Kaoru Matsuo, Kirishima (JP)

(73) Assignee: Kyocera Corporation, Kyoto (JP)

( * ) Notice: Subject to any disclaimer, the term of this patent is extended or adjusted under 35 U.S.C. 154(b) by 717 days.

(21) Appl. No.: 12/293,110

(22) PCT Filed: Mar. 29, 2007

(86) PCT No.: PCT/JP2007/056815
§ 371 (c)(1),
(2), (4) Date: Sep. 16, 2008

(87) PCT Pub. No.: WO2007/114224
PCT Pub. Date: Oct. 11, 2007

(65) Prior Publication Data
US 2009/0091904 A1 Apr. 9, 2009

(30) Foreign Application Priority Data

| Mar. 29, 2006 | (JP) | 2006-090338 |
| Mar. 29, 2006 | (JP) | 2006-091518 |
| May 29, 2006 | (JP) | 2006-148930 |
| May 29, 2006 | (JP) | 2006-148931 |
| Jun. 29, 2006 | (JP) | 2006-179256 |
| Aug. 29, 2006 | (JP) | 2006-232018 |

(51) Int. Cl.
*H05K 3/00* (2006.01)

(52) U.S. Cl. ........ 361/764; 361/760; 361/800; 361/816; 361/818; 361/730; 257/659; 257/728

(58) Field of Classification Search ............ 361/760, 361/800, 816–818, 730; 257/659, 728, 687
See application file for complete search history.

(56) References Cited

U.S. PATENT DOCUMENTS 5,912,592 A 6/1999 Kikushima .................. 331/158
6,974,724 B2 * 12/2005 Hyvonen et al. ............. 438/107

FOREIGN PATENT DOCUMENTS

| JP | 03-233959 A | 10/1991 |
| JP | 11-055062 | * 2/1999 |
| JP | 11-055062 A | 2/1999 |
| JP | 11-330859 A | 11/1999 |
| JP | 2002-185338 A | 6/2002 |
| JP | 2004-172176 A | 6/2004 |

* cited by examiner

Primary Examiner — Tuan T Dinh
Assistant Examiner — Hung Dang
(74) Attorney, Agent, or Firm — DLA Piper LLP (US)

(57) ABSTRACT

An electronic component 3 with a shielding function whose upper surface is held at a reference potential, an electronic component 13, and a semiconductor component 4 are mounted on a wiring board 2, and are covered with an insulating resin portion 5 while a conductive layer 6 is formed on an upper surface of the insulating resin portion 5. The conductive layer 6 is held at the reference potential by being connected to a portion, which is held at the reference potential, of the electronic component 3 with a shielding function exposed from the insulating resin portion 5. There can be provided a small-sized circuit module superior in an electromagnetic shielding function.

14 Claims, 13 Drawing Sheets

CIRCUIT MODULE AND RADIO COMMUNICATIONS EQUIPMENT, AND METHOD FOR MANUFACTURING CIRCUIT MODULE

CROSS-REFERENCE TO RELATED APPLICATIONS

The present application is a national stage of International Application No. PCT/JP2007/056815 filed on Mar. 29, 2007, and claims the benefit of priority under 35 USC 119 of Japanese Patent Application Nos.: 2006-090338 filed on Mar. 29, 2006; 2006-091518 filed on Mar. 29, 2006; 2006-148930 filed on May 29, 2006; 2006-148931 filed on May 29, 2006; 2006-179256 filed on Jun. 29, 2006 and 2006-232018 filed on Aug. 29, 2006, the contents of which applications are incorporated herein by reference.

TECHNICAL FIELD

The present invention relates to a circuit module mainly employed for radio communications equipment.

BACKGROUND ART

In recent years, circuit modules having a plurality of electronic components including semiconductor components and passive elements mounted on their wiring boards have rapidly spread. The circuit modules are employed for radio communications equipment such as cellular phones and have the functions of processing high-frequency signals.

In order to thus process the high-frequency signals, shielding layers having electromagnetic shielding functions are formed in the circuit modules such that unnecessary electromagnetic waves do not leak outward while restraining the effects of electromagnetic waves from the exterior. In such conventional circuit modules, metal covers have been most commonly used as the shielding layers.

In order to reduce the heights of the circuit modules, however, it is favorable to cover the electronic components with insulating resin materials. However, the insulating resin materials do not have the electromagnetic shielding functions. Therefore, the functions must be newly added to the insulating resin materials.

Therefore, circuit modules having shielding layers formed therein by sealing electronic components mounted on wiring boards with insulating resin materials and covering the insulating resin materials with conductive resins have been proposed (see, for example, Patent Document 1). The operations of the circuit modules can be stabilized by connecting the conductive resins to ground electrodes provided in the wiring boards.

Furthermore, the necessities of not only electromagnetic shielding from the exterior but also shielding electromagnetic waves between electronic components that are placed on wiring boards have arisen with recent higher frequencies.

When the electronic components including high-frequency power amplifiers are mounted on the wiring boards, for example, unnecessary electromagnetic waves generated from power amplifiers may adversely affect the other electronic components on the wiring boards. In order to shield the electromagnetic waves generated from the power amplifiers, therefore, configurations in which shielding plates are disposed between the electronic components including power amplifiers and the other electronic components have been proposed (see, for example, Patent Document 2).

FIG. 30 is a cross-sectional view of a conventional circuit module having the above-mentioned shielding plate disposed therein. In such a conventional high-frequency module, a semiconductor component 102a including a power amplifier and the other electronic component 102b are arranged side by side on a wiring board 101, and are covered with a metal cover 103. Between the semiconductor component 102a and the other electronic component 102b, a shielding plate 105 made of a metal is formed so as to separate both the components. The shielding plate 105 has its upper end connected to a ceiling surface of the metal cover 103 and has its lower end connected to a ground electrode provided on the wiring board. This allows unnecessary electromagnetic waves from the semiconductor component 102a to be effectively shielded.

Patent Document 1: JP 2004-172176 A
Patent Document 2: JP 2002-185338 A

DISCLOSURE OF THE INVENTION

Problems to be Solved by the Invention

However, there is demanded a circuit module whose height can be made much lower, as compared with the conventional circuit module in which the shielding layer is formed by sealing the electronic component mounted on the wiring board with the insulating resin material and covering the insulating resin material with the conductive resin.

In the above-mentioned circuit module using the metal cover 103, a space in which the metal cover 103 is to be placed and fixed on the wiring board 101 must be provided, which interferes with miniaturization of the circuit module.

When the metal cover 103 is placed on the wiring board 101, for example, the shielding plate 105 connected to the metal cover 103 may, in some cases, come into contact with the electronic component to damage the shielding plate 105 or the electronic component. Particularly when the shielding plate 105 is damaged, the function of shielding electromagnetic waves is decreased.

Furthermore, the shielding plate 105 of the optimized size must be prepared in conformity with the size of the metal cover 103 and the size of the semiconductor component 102a, so that the productivity of the circuit module is low. Particularly when the circuit module is manufactured using a master board having a plurality of board regions, work for mounting the metal cover 103 must be performed for each of the board regions, and shielding plates 105 whose number corresponds to the number of metal covers 103 must be prepared, which greatly interferes with improvements in the productivity of the circuit module.

A principle object of the present invention is to provide a circuit module that is superior in electromagnetic shielding function, can be miniaturized and reduced in height, and is superior in productivity and a method for manufacturing the same.

Means for Solving the Problems

A circuit module according to the present invention includes a wiring board, a plurality of electronic components that are mounted on the wiring board, a reference potential portion that is provided on an upper surface of at least one of the plurality of electronic components, an insulating resin portion that covers the plurality of electronic components, excluding the reference potential portion, and a conductive layer that is connected to the reference potential portion and covers an upper surface of the insulating resin portion.

According to the circuit module having this configuration, the plurality of electronic components are covered with the conductive layer connected to the reference potential portion in at least one of the electronic components that is provided with the reference potential portion (hereinafter referred to as the "electronic component having the reference potential portion") mounted on the wiring board. This causes unnecessary electromagnetic waves from the exterior to be shielded, allowing the circuit module to be stably operated. Moreover, this eliminates the necessity of separately forming a predetermined electrode for holding the conductive layer at the reference potential on the upper surface of the wiring board, which allows the wiring board to be miniaturized, and thus can be used to miniaturize the circuit module.

If the height position of the upper surface of the electronic component having the reference potential portion is made higher than the respective height positions of the upper surfaces of the other electronic components, the conductive layer can be simply connected to the reference potential portion.

Making the height of the upper surface of the insulating resin portion and the height of the electronic component having the reference potential portion equal to each other causes the whole upper surface of the electronic component having the reference potential portion to be exposed from the insulating resin portion. The conductive layer is made to adhere to the exposed portion, so that the conductive layer is more reliably held at the reference potential. In addition, the upper surface of the insulating resin portion lines up with the upper surface of the electronic component having the reference potential portion, whose height is more than those of the other electronic components, so that large irregularities and steps are not formed on the upper surface of the conductive layer. When the circuit module is conveyed by suction, the suction can be reliably applied. Furthermore, the upper surface of the conductive layer can be marked in a good condition.

If the electronic component having the reference potential portion includes a container, a metal plate fixed to an upper surface of the container, a piezoelectric vibration element contained in the container, and a ground terminal formed on an outer surface of the container, the metal plate is connected to the ground terminal through wiring of the container. This causes the metal plate held at the reference potential to shield surrounding electromagnetic waves, allowing the electrical characteristics of the piezoelectric vibration element to be stabilized. At the same time, the conductive layer can be simply conducted to the reference potential using the metal plate held at the reference potential without being pulled to the wiring board.

Furthermore, the conductive layer may be made to adhere to a side surface of the metal plate, and the height of an upper surface of the conductive layer and the height of the electronic component having the reference potential portion may be equal to each other. Thus making the height position of the upper surface of the conductive layer and the height position of the upper surface of the electronic component having the reference potential portion equal to each other allows a thickness from the uppermost layer of the wiring board to the upper surface of the conductive layer to be made substantially equal to the thickness of the electronic component having the reference potential portion, allowing the height and the size of the circuit module to be further reduced.

Furthermore, when the electronic component having the reference potential portion is a semiconductor component including a semiconductor board, a through conductor that penetrates the semiconductor board in the thickness direction, and an electrode pad for a reference potential formed on a lower surface of the semiconductor board and electrically connected to the through conductor, a portion, which is led out to an upper surface of the semiconductor board, of the through conductor is taken as the reference potential portion, which eliminates the necessity of separately forming a ground electrode for holding the conductive layer at the reference potential. This allows the wiring board to be miniaturized, and thus allows the whole configuration of the circuit module to be miniaturized.

Here, if the height position of the upper surface of the semiconductor component is made higher than the respective height positions of the upper surfaces of the other electronic components, the conductive layer can be simply made to adhere to the reference potential.

Furthermore, making the height position of the upper surface of the insulating resin portion and the height position of the upper surface of the semiconductor component equal to each other causes the upper surface of the insulating resin portion to line up with the upper surface of the highest semiconductor component. Therefore, larger irregularities and steps are not formed in the conductive layer formed on the upper surface of the insulating resin layer, as compared with those in a case where the height position of the upper surface of the insulating resin portion is set lower than the height position of the upper surface of the semiconductor component. When the circuit module is conveyed by suction, therefore, the suction can be reliably applied, which can be used to improve the productivity of the circuit module.

The circuit module according to the present invention may have a configuration in which the plurality of electronic components include a first semiconductor component and a second semiconductor component, an insulating resin portion positioned between the first semiconductor component and the second semiconductor component is provided with a groove that separates both the semiconductor components, a shielding member composed of a conductive material is buried in the groove, and the shielding member is electrically connected to the conductive layer. According to the circuit module having this configuration, the shielding member that separates both the electronic components can be formed between the electronic components without using a metal cover, which causes unnecessary electromagnetic waves moving back and forth between the first semiconductor component and the second semiconductor component to be shielded, allowing the operation of the circuit module to be stabilized. Moreover, heat generated from the exothermic electronic component can be radiated outward through the conductive layer without providing a complicated heat radiation structure inside the wiring board, which causes the internal configuration of the wiring board to be simplified while allowing the degree of design freedom of the internal wiring to be improved. This allows the wiring board to be miniaturized, and thus allows the whole configuration of the circuit module to be miniaturized.

Note that the conductive layer may, in some cases, be referred to as a "radiator" in the present specification, paying attention to the heat radiating function of the conductive layer.

If the first semiconductor component is an RFIC, and the second semiconductor component is a baseband IC, heat generated from the RFIC is radiated outward through the conductive layer from the shielding member, so that the heat is not easily transmitted to the baseband IC. Thus, the stability of the operation of the baseband IC can be ensured.

If the electronic component for RF is arranged in one, where the RFIC is disposed, of two regions separated by the shielding member, the interference of signals between the RF-based electronic component including the RFIC and the control-based electronic component including the baseband IC is restrained, which allows the circuit module to be more stably operated.

Furthermore, if a bottom surface of the groove is positioned within the wiring board, the shielding member allows the interference of the signals between the RF-based component and the control-based component in the wiring board to be further reduced, allowing the operation of the circuit module to be stabilized.

A circuit module according to the present invention includes a wiring board, a plurality of electronic components that are mounted on the wiring board, at least one, which is exothermic, of the plurality of electronic components, an insulating resin portion that covers the plurality of electronic components, excluding at least a part of the exothermic electronic component, and a radiator composed of a conductive material for covering the part, which is not covered with the insulating resin portion, of the exothermic electronic component and an upper surface of the insulating resin portion.

According to the circuit module having this configuration, much of heat generated from the exothermic electronic component is transmitted to the radiator from the exothermic electronic component and is radiated outward.

Furthermore, if the radiator is electrically connected to the conductor for a reference potential, the effect of electromagnetically shielding the whole circuit module is also obtained by the radiator.

If an upper part of the exothermic electronic component is buried in the radiator, the contact area between the exothermic electronic component and the radiator is increased. Therefore, the heat generated from the exothermic electronic component can be more efficiently radiated outward.

If the radiator is provided with a plurality of grooves, the surface area of the radiator is increased. Therefore, heat radiation properties to the exterior can be enhanced.

Radio communications equipment according to the present invention includes the circuit module according to the present invention, and an antenna and a transmitting/receiving circuit that are connected to the circuit module, and is small in size and is superior in productivity.

A method for manufacturing a circuit module according to the present invention includes a step A of preparing a master board having a plurality of board regions arranged in a matrix shape, a step B of respectively mounting a plurality of electronic components including an electronic component having a reference potential portion on its upper surface on the board regions of the master board, a step C of forming an insulating resin portion that covers respective upper surfaces of the board regions while covering a part or the whole of the electronic component having the reference potential portion so as to expose the reference potential portion, and a step D of forming a conductive layer that covers an upper surface of the insulating resin portion so as to be connected to an exposed portion of the reference potential portion. Therefore, the insulating resin and the conductive layer can be collectively formed on the whole surface of the master board, so that the productivity of the circuit module can be improved more rapidly, as compared with that in a conventional method for manufacturing a circuit module in which a metal cover is provided for each region.

The foregoing and other advantages, features, and effects of the present invention will become more apparent from the following description of the present invention when taken in conjunction with the accompanying drawings

DESCRIPTION OF REFERENCE NUMERALS

Figure 1:
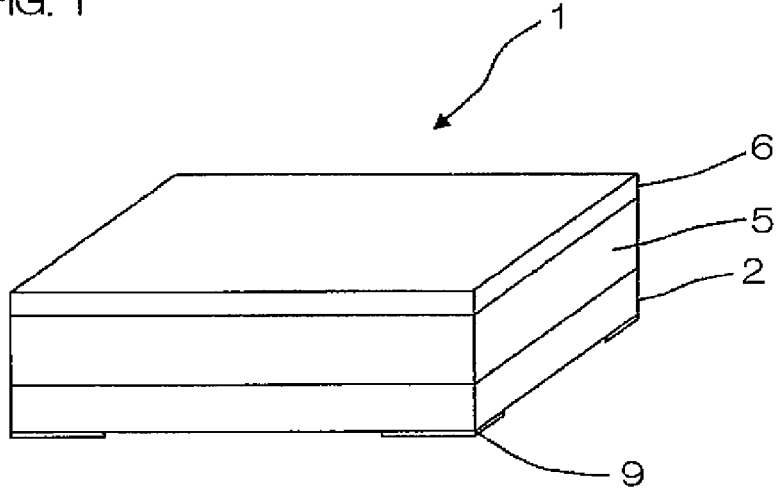
FIG. 1 is a perspective view of the appearance of a circuit module according to an embodiment of the present invention.

1: circuit module
2: wiring board
3: electronic component with a shielding function 4: semiconductor component
5: insulating resin
6: conductive layer (radiator)
13: various electronic components
41: first semiconductor component
42: second semiconductor component
44: through conductor
51: path
53: groove
54: shielding member
61: groove

BEST MODE FOR CARRYING OUT THE INVENTION

Circuit Module

Figure 2:
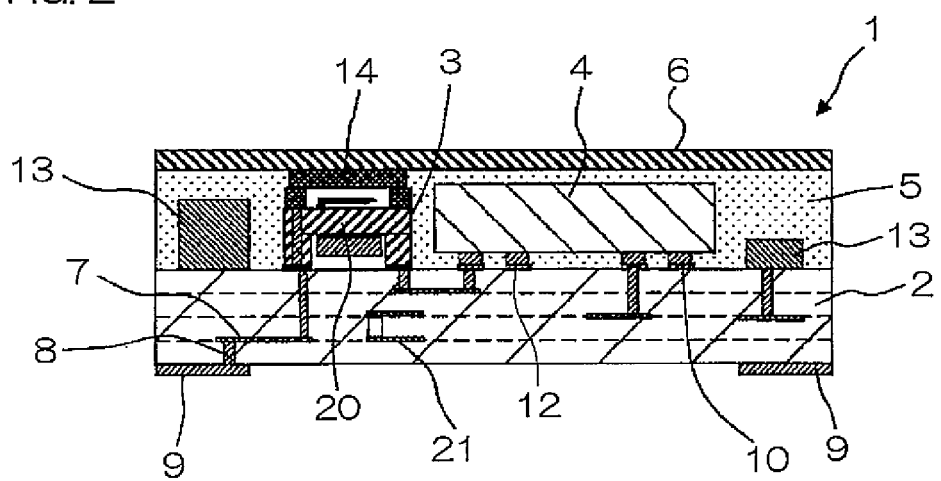
FIG. 2 is a cross-sectional view of the circuit module shown in FIG. 1.

FIG. 1 is a perspective view of the appearance of a circuit module according to an embodiment of the present invention, and FIG. 2 is a cross-sectional view of the circuit module shown in FIG. 1.

The circuit module 1 includes a wiring board 2, a plurality of electronic components mounted side by side on the wiring board 2, an insulating resin portion 5 that covers the plurality of electronic components, and a conductive layer 6 that covers the insulating resin portion 5. The plurality of electronic components includes an electronic component 3 with a shielding function and a semiconductor component 4. An "electronic component with a shielding function" in the present invention means an electronic component having the function of electromagnetically shielding an element disposed therein.

The wiring board 2 is a board in a substantially rectangular parallelepiped shape having dimensions of 7 mm by 5 mm by 0.4 mm (thick), for example, and is formed by laminating a plurality of insulating layers mainly composed of a ceramic material such as glass-ceramic, alumina, or mullite.

Particularly, when the circuit module 1 is employed for high-frequency equipment, it is desirable that a glass-ceramic material is used for the wiring board 2. Using the glass-ceramic material makes it easy to use Cu or Ag serving as a low resistive conductor as wiring.

The wiring board 2 is produced by applying a conductive paste serving as circuit wiring or a connection pad to a surface of a ceramic green sheet obtained by adding and mixing a suitable organic solvent to and with ceramic material powder using screen printing or the like while laminating a plurality of conductive pastes, and press-molding an obtained laminate, followed by calcination at high temperature.

In the wiring board 2, internal wiring 7 disposed between the insulating layers, a via hole conductor 8 penetrating the insulating layers, and so on are formed. The wiring board 2 has an external terminal 9 formed on its lower surface, and has an electrode pad 10 for mounting various electronic components formed on its upper surface.

The internal wiring 7, the external terminal 9, and the electrode pad 10, described above, are formed of a material mainly composed of a metal such as Ag, Cu, W, or Mo. They are formed by applying a conductive paste containing Ag-based powder, a borosilicate-based low-melting glass frit, an organic binder such as ethyl cellulose, an organic solvent, or the like on a ceramic green sheet serving as each of the insulating layers composing the wiring board 2, followed by calcination.

The electronic component 3 with a shielding function, the semiconductor component 4, and various electronic components 13 such as a capacitor, a resistor, an inductor, and an SAW (Surface Acoustic Wave) filter are mounted on the wiring board 2.

Examples of the electronic component 3 with a shielding function include a crystal vibrator, an SAW filter, and a temperature compensated crystal oscillator.

In the present embodiment, the temperature compensated crystal oscillator is employed.

Figure 3:
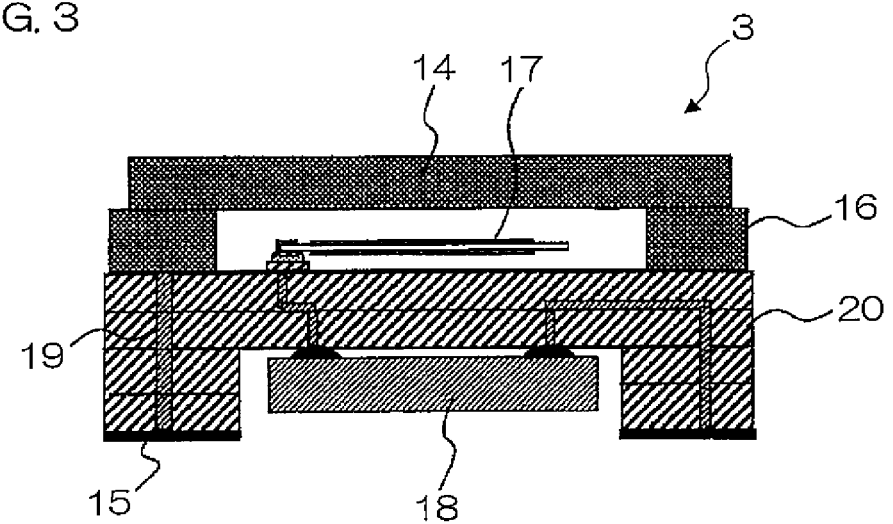
FIG. 3 is a cross-sectional view of a temperature compensated crystal oscillator mounted on the circuit module shown in FIG. 1.

FIG. 3 is a cross-sectional view of the electronic component 3 with a shielding function serving as the temperature compensated crystal oscillator. As shown in FIG. 3, the electronic component 3 with a shielding function includes a container 20 on which a crystal vibration element 17 and an IC chip 18 are to be mounted, a metal ring 16 and a metal plate 14 that are fastened to an upper surface of the container 20, and a ground terminal 15 formed on a lower surface of the container 20. Note that the metal plate 14 is fastened to the wiring board 2 through the metal ring 16, and the metal plate 14 and the metal ring 16 are a "reference potential portion" held at a reference potential. Although a "reference potential" in the present invention is substantially a ground potential, it is not necessarily limited to zero bolt.

Furthermore, the crystal vibration element 17 serving as a piezoelectric vibration element is mounted on the upper surface of the container 20, a cavity is provided on the lower surface of the container 20, and the IC chip 18 that controls an oscillation output on the basis of the vibration of the crystal vibration element 17 is mounted in the cavity. Note that the IC chip 18 stores temperature compensation data, and the temperature characteristics of the oscillation output are corrected on the basis of the temperature compensation data.

The metal plate 14 in the electronic component 3 with a shielding function is connected to the ground terminal 15 through wiring 19 provided in the container 20. This causes the crystal vibration element 17 to be surrounded by the metal plate 14 and the metal ring 16 that are held at the reference potential, which causes surrounding unnecessary electromagnetic waves to be shielded, allowing the electrical characteristics of the crystal vibration element 17 to be stabilized.

Note that the ground terminal 15 provided on the lower surface of the container 20 is connected to the external terminal 9 for grounding provided on the lower surface of the wiring board 2 through the internal wiring 7 and the via hold conductor 8 that are provided in the wiring board 2, as shown in FIG. 2.

The semiconductor component 4 is mounted on the wiring board 2 in such a manner as to be adjacent to the electronic component 3 with a shielding function. The semiconductor component 4 is an IC chip of a flip-chip type having a configuration in which circuit wiring composed of Al or the like is formed on a surface of a semiconductor board composed of Si, GaAs, or the like. The semiconductor component 4 is electrically and mechanically connected to the wiring board 3 by taking a surface, on which the circuit wiring is formed, of the semiconductor component 4 as a lower surface and connecting a bump 12 composed of Au or the like provided on the lower surface and the electrode pad 10 provided on the wiring board to each other using conductive adhesives such as a solder.

Note that the semiconductor component 4 is an RFIC (Radio Frequency Integrated Circuit) including an RF receiving circuit that amplifies and frequency-converts a signal received by an antenna (ANT) and outputs a demodulation signal to a baseband IC and an RF transmission circuit that frequency-converts a signal from the baseband IC and outputs the frequency-converted signal to the antenna, for example.

Various electronic components 13 such as a capacitor, a resistor, an inductor, and an SAW filter are mounted, in addition to the electronic component 3 with a shielding function and the semiconductor component 4, described above, on the upper surface of the wiring board 2, a passive component 21 such as a filter element is formed in the wiring board 2. The electronic components 13 and the passive component 21 are electrically connected to each other, to constitute a predetermined circuit.

In the present embodiment, the height position of the upper surface of the electronic component 3 with a shielding function is set to be the highest of the respective height positions of the upper surfaces of the electronic component 3 with a shielding function, the semiconductor component 4, and the various electronic components 13 that are mounted on the upper surface of the wiring board 2. This allows the upper surface of the electronic component 3 with a shielding function to be exposed when the semiconductor component 4 and the various electronic components 13 are covered with the insulating resin portion 5, described later. Accordingly, the conductive layer 6 can be simply made to adhere to a portion, which is held at the reference potential, of the electronic component 3 with a shielding function.

Furthermore, the insulating resin portion 5 is formed on the wiring board 2. The insulating resin portion 5 covers the semiconductor component 4, the various electronic components 13, and the upper surface of the wiring board 3 in such a manner that the upper surface of the electronic component 3 with a shielding function is exposed.

The insulating resin portion 5 is formed of an insulating resin material such as phenol resin or epoxy resin, covers the semiconductor component 4 and the various electronic components 13 to protect them while enhancing the mechanical strength of the circuit module 1 itself.

Furthermore, the circuit module 1 using the insulating resin portion 5 can radiate Joule heat generated from the semiconductor component 4 or the like outward more efficiently, as compared with the conventional circuit module in which the semiconductor component 4 and the like are merely covered with a metal cover. That is, when the semiconductor component 4 and the like are covered with the metal cover, heat generated from the semiconductor component 4 is hardly radiated toward the wiring board because there is an air layer having a low coefficient of thermal conductivity around the semiconductor component 4. However, heat is also radiated to the insulating resin portion 5 by covering the semiconductor component 4 with the insulating resin portion 5 having a higher coefficient of thermal conductivity than air as in the present invention, which can prevent excessive heat from being stored in the semiconductor component 4.

The insulating resin portion 5 is applied to the upper surface of the wiring board 2 so as to cover the electronic component 3 with a shielding function, the semiconductor component 4, the various electronic components 13, and the upper surface of the wiring board 2.

At least a portion, which is held at the reference potential, of the electronic component 3 with a shielding function, that is, a part of the metal ring 16 or the metal plate 14 is not covered with the insulating resin portion 5. This is for rendering the conductive layer 6 adhere to the portion held at the reference potential.

The applied insulating resin portion 5 is cured by being heated at 150° C. for thirty minutes, for example.

Here, if the height position of the upper surface of the insulating resin portion 5 and the height position of the upper surface of the electronic component 3 with a shielding function are made equal to each other, the whole upper surface of the electronic component 3 with a shielding function is exposed from the insulating resin portion 5, and the conductive layer 6 is made to adhere to the exposed portion. Therefore, the conductive layer 6 can be more reliably held at the reference potential.

In addition, the upper surface of the insulating resin portion 5 lines up with the upper surface of the highest electronic component 3 with a shielding function, so that the upper surface of the insulating resin portion 5 is flattened. That is, in a case where the upper surface of the insulating resin portion 5 is lower than the upper surface of the highest electronic component 3 with a shielding function, when the conductive layer 6 is formed so as to cover the upper surface of the insulating resin portion 5, the conductive layer 6 has steps formed therein by its portion corresponding to the electronic component 3 with a shielding function projecting. On the other hand, if the height position of the upper surface of the insulating resin portion 5 and the height position of the upper surface of the electronic component 3 with a shielding function are made equal to each other, the conductive layer 6 formed on the insulating resin portion 5 does not have large steps formed therein. When the circuit module 1 is conveyed by suction, for example, therefore, the suction can be reliably applied, which can be used to improve productivity. Furthermore, the upper surface of the conductive layer 6 can be also marked in a good condition.

Examples of the conductive layer 6 covering the upper surface of the insulating resin portion 5 include a conductive resin material and a metal film. However, it is preferable that the conductive layer 6 is formed of a metal sintered layer composed of only sintered metal particles such as Ag from the viewpoint of productivity. When the circuit module 1 is incorporated into a cellular phone or the like that handles a radio frequency of not less than 800 MHz, the metal sintered layer is particularly effective.

Here, preferable as the metal sintered layer is one containing few resin components such as binders and obtained by sintering metallic fine particles. The metal sintered layer is formed by dispersing metal nano particles having an average particle diameter of 1 nm to 100 nm and more suitably an average particle diameter of 10 nm to 50 nm in an organic-based dispersion solvent such as toluene, terpineol, xylen, or tetradecane, bringing the particles into a paste, and then applying the paste to the upper surface of the insulating resin portion 5, followed by heating at 130 to 300° C. Thus using the metal particles on the nano order causes a dense metal layer to be formed, allowing an electromagnetic noise from the exterior to be effectively shielded. Furthermore, the metal particles on the nano order are sintered at a relatively low temperature of 130 to 300° C. Therefore, the conductive layer 6 can be formed without degrading the insulating resin portion 5, the semiconductor component 4, and so on by high-temperature heating. Although description was made of a case where the metal sintered layer is composed of Ag, it may be composed of a metal other than Ag, for example, Cu or Ni. Furthermore, the thickness of the conductive layer 6 formed of the metal sintered layer is set to 5 to 10 μm, for example.

Figure 4:
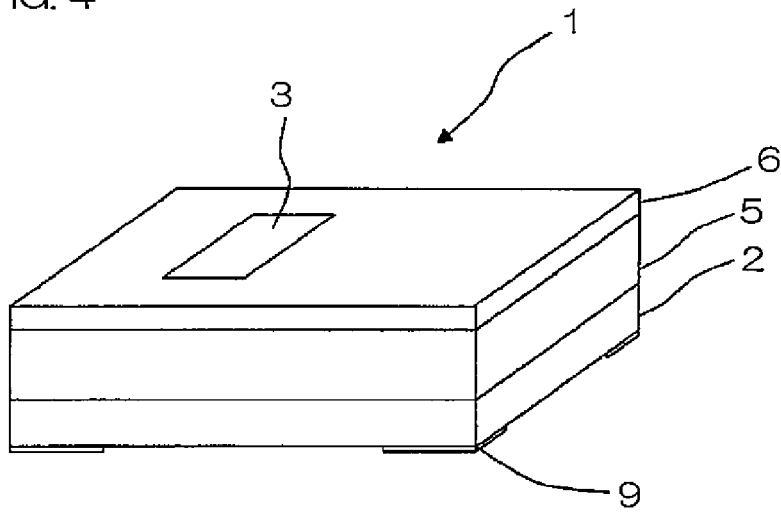
FIG. 4 is a perspective view of a circuit module according to another embodiment of the present invention.
Figure 5:
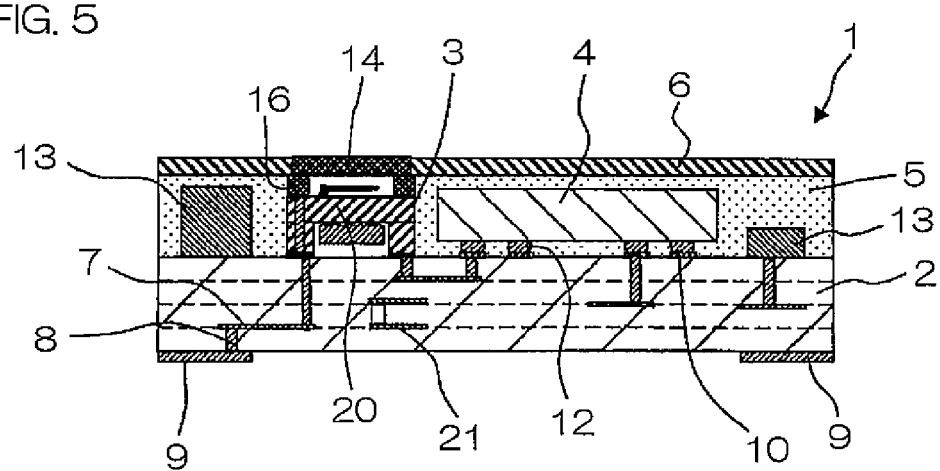
FIG. 5 is a cross-sectional view of the circuit module shown in FIG. 4.

According to the above-mentioned circuit module 1, the semiconductor component 4, the various electronic components 13, and the upper surface of the wiring board 2 are covered with the conductive layer 6 that is made to adhere to the portion, which is held at the reference potential, of the electronic component 3 with a shielding function mounted on the wiring board 2. This causes unnecessary electromagnetic waves from the exterior to be shielded, allowing the circuit module 1 to be stably operated. Moreover, this eliminates the necessity of separately providing the wiring board 2 with a ground electrode for holding the conductive layer 6 at the reference potential, which allows the wiring board 2 to be miniaturized, and thus can be used to miniaturize the circuit module 1. Furthermore, the conductive layer 6 is made to adhere to the portion (the metal plate 14), which is held at the reference potential, of the electronic component 3 with a shielding function. This allows the conductive layer 6 to be simply conducted to the reference potential portion without FIG. 4 is a perspective view showing another embodiment of the circuit module 1. FIG. 5 is a cross-sectional view of the circuit module 1 shown in FIG. 4.

A characteristic of the circuit module 1 is that the height position of the upper surface of the conductive layer 6 and the height position of the upper surface of the electronic component 3 with a shielding function are equal to each other. Therefore, the upper surface of the electronic component 3 with a shielding function is exposed to the exterior, as shown in FIG. 4.

The conductive layer 6 is held at the reference potential by being made to adhere to a side surface of the metal plate 14 and the metal ring 16, as shown in FIG. 5. Such a configuration allows a thickness from the uppermost layer of the wiring board 2 to the upper surface of the conductive layer 6 to be substantially equal to the thickness of the electronic component 3 with a shielding function, allowing the height and the size of the circuit module 1 to be further reduced. Furthermore, large irregularities are not formed in the conductive layer 6. When the circuit module 1 is conveyed by suction, for example, the suction can be reliably applied, which can be used to improve productivity. Furthermore, the upper surface of the conductive layer 6 can be marked in a good condition.

Figure 6:
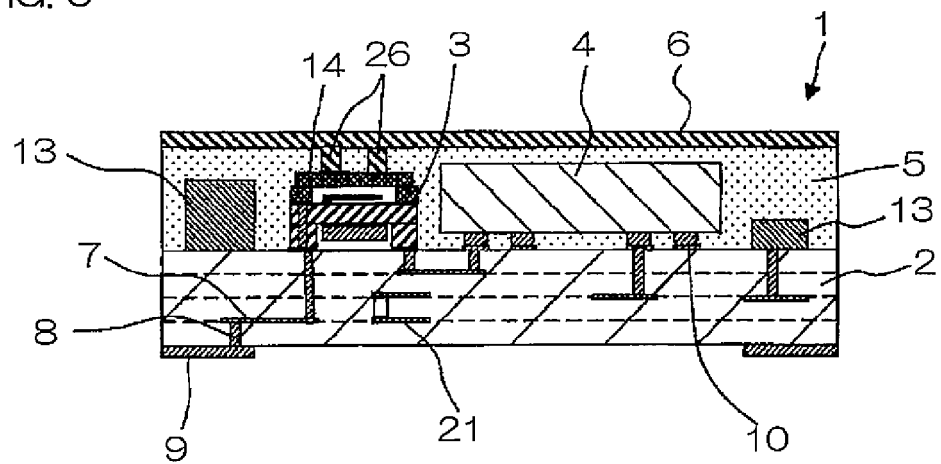
FIG. 6 is a cross-sectional view of a circuit module according to still another embodiment of the present invention.

Although in the above-mentioned embodiment, description was made of the circuit module 1 in which the height position of the upper surface of the electronic component 3 with a shielding function is higher than the height position of the upper surface of the semiconductor component 4 as an example, the present invention is also applicable to a case where the height position of the upper surface of the electronic component 3 with a shielding function is lower than the height position of the upper surface of the semiconductor component 4. In this case, in order to make the conductive layer 6 adhere to the portion, which is held at the reference potential, of the electronic component 3 with a shielding function, a conductive path 26 for connecting the conductive layer 6 and the metal plate 14 in the electronic component 3 with a shielding function may be provided, as shown in FIG. 6. This conductive path 26 is formed of the same material as the conductive layer 6.

Figure 7:
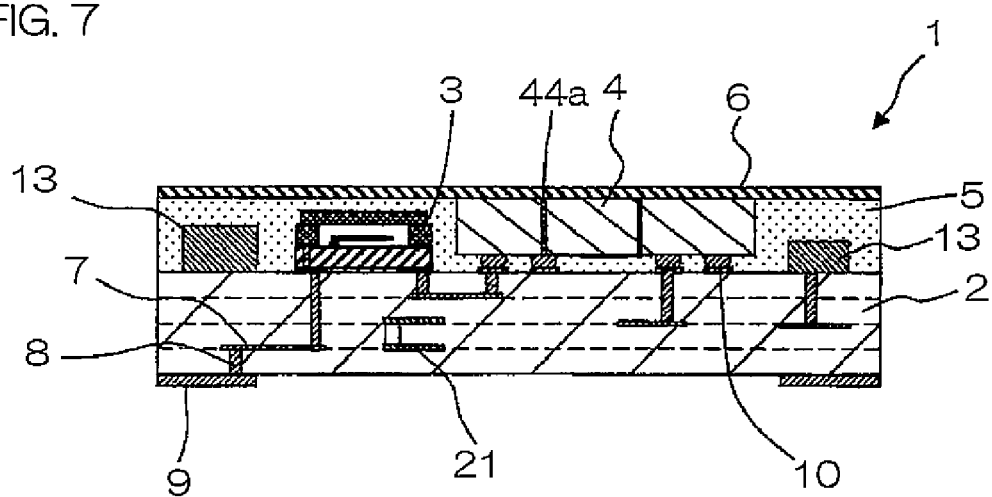
FIG. 7 is a cross-sectional view of a circuit module according to still another embodiment of the present invention.

FIG. 7 is a cross-sectional view showing another embodiment of the circuit module 1 according to the present invention. The same constituent elements as those in the above-mentioned embodiments (FIGS. 1 to 5, and FIG. 6) are assigned the same reference numerals and hence, the overlapped description is omitted.

In the present embodiment, a relatively low crystal vibrator is used as an electronic component 3 with a shielding function. A characteristic of the present embodiment is that a semiconductor component 4 is provided with a reference potential portion.

Figure 8:
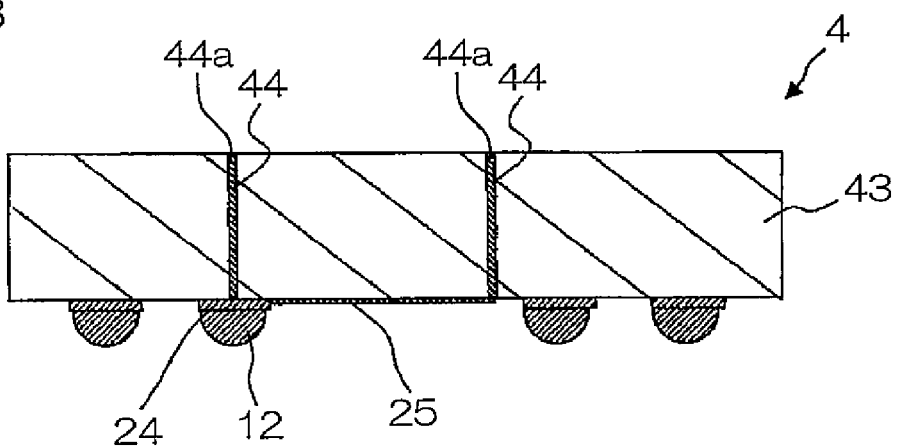
FIG. 8 is a cross-sectional view of a semiconductor component employed for the circuit module shown in FIG. 7.

FIG. 8 is a cross-sectional view of the semiconductor component 4 used for the circuit module 1 shown in FIG. 7. The semiconductor component 4 includes a semiconductor board 43, a through conductor 44, and an electrode pad 24 for a reference potential (hereinafter referred to as a ground electrode pad 24) formed on a mounting surface of the semiconductor component 4.

The semiconductor board 43 is composed of a semiconductor material such as Si or GaAs. Note that a re-wiring layer for pulling wiring may be formed, as needed, on a mounting surface of the semiconductor board 43.

The through conductor 44 is formed so as to penetrate the semiconductor board 43 in the thickness direction. The through conductor 44 has its upper end led out to a surface (upper surface) on the opposite side of the mounting surface of the semiconductor board 43, and such a lead-out portion 44a is the reference potential portion. On the other hand, the through conductor 44 has its lower end led out to the mounting surface of the semiconductor board 43 and connected to the ground electrode pad 24 directly or through wiring 25.

The ground electrode pad 24 is electrically connected to an external terminal 9 for grounding provided on a lower surface of a wiring board 2 through a bump 12. This causes the through conductor 44 to be held at a ground potential.

The through conductor 44 is formed by etching the semiconductor board 43 to form a through hole, and then filling the through hole with a metal material such as Cu or plating a metal material such as Cu on an inner surface of the through hole.

When the through hole is filled with the metal material, it is preferable that a paste material mainly composed of metal particles on the nano order is used. Specifically, the through conductor 44 is formed by dispersing metal nano particles having an average particle diameter of 1 nm to 100 nm and more suitably an average particle diameter of 10 nm to 50 nm in an organic-based dispersion solvent such as toluene, terpineol, xylen, or tetradecane, bringing the particles into a paste, and then filling the through hole with the paste, followed by heating at 130 to 300° C. The paste thus mainly composed of the metal nano particles can be made lower in viscosity, as compared with a general conductive paste. Therefore, a minute through hole provided in the semiconductor board 43, for example, a through hole having a diameter of 10 μm to 45 μm can be more reliably filled with the paste.

Furthermore, the through hole may be formed by laser processing.

A conductive layer 6 is made to adhere to the lead-out portion 44a, which is led out to the surface (upper surface) on the opposite side of the mounting surface of the semiconductor board 43, of the through conductor 44, as shown in FIG. 7. This causes the conductive layer 6 to be held at a ground potential, and causes unnecessary electromagnetic waves from the exterior to be shielded, allowing the circuit module 1 to be stably operated.

When the reference potential portion is thus formed in the semiconductor component 4, it is preferable that the height position of the upper surface of the semiconductor component 4 is made higher than the respective height positions of the upper surfaces of the other electronic components mounted on the upper surface of the wiring board 2. This allows the conductive layer 6 to be made to adhere to the reference potential portion very simply. Here, if the height position of the upper surface of the insulating resin portion 5 and the height position of the upper surface of the semiconductor component 4 are made equal to each other, the conductive layer 6 formed on the upper surface of the insulating resin portion 5 can be flattened. That is, in a case where the upper surface of the insulating resin portion 5 is lower than the upper surface of the highest semiconductor component 4, when the conductive layer 6 is formed so as to cover the upper surface of the insulating resin portion 5, the conductive layer 6 has steps formed therein by its portion corresponding to the semiconductor component 4 projecting. On the other hand, if the height position of the upper surface of the insulating resin portion 5 and the height position of the upper surface of the semiconductor component 4 are made equal to each other, the conductive layer 6 formed on the insulating resin portion 5 does not have steps formed therein. When the circuit module 1 is conveyed by suction, for example, therefore, the suction can be reliably applied, which can be used to improve productivity. Furthermore, the upper surface of the conductive layer 6 can be also marked in a good condition. Therefore, it is preferable that the height position of the upper surface of the insulating resin portion 5 and the height position of the upper surface of the semiconductor component 4 are made equal to each other.

Although in the above-mentioned embodiment, the conductive layer 6 is connected to the reference potential portion provided in one of the electronic component 3 with a shielding function and the semiconductor component 4, the conductive layers 6 may be respectively connected to the reference potential portions provided in both the electronic component 3 with a shielding function and the semiconductor component 4.

Description is then made of another embodiment of the present invention. The same constituent elements as those in the above-mentioned embodiments (FIGS. 1 to 8) are assigned the same reference numerals and hence, the overlapped description is omitted.

A plurality of electronic components that are mounted on a wiring board include an exothermic electronic component that generates heat when a circuit module 1 is employed. When the heat generated from the exothermic electronic component is not dissipated outward, excessive heat is stored in the exothermic electronic component itself. Therefore, the electrical characteristics of the exothermic electronic component greatly vary, so that the operation of the circuit module 1 becomes unstable.

In order to radiate the heat generated from the exothermic electronic component out of the circuit module 1, a heat radiation structure in which a wiring board is provided with a plurality of thermal via conductors has been conventionally used. Specifically, a plurality of thermal via conductors that penetrate the wiring board are provided in a region, directly below the exothermic electronic component, of the wiring board, and the thermal via conductors are connected to a heat radiation pad set up on a lower surface of the wiring board. The heat generated by the exothermic electronic component is conducted to the heat radiation pad through the thermal via conductors, and is radiated out of the circuit module 1 (see Patent Document 1, described above).

A large number of internal wirings are provided in the wiring board constituting the circuit module 1. When the wiring board is provided with a heat radiation structure including a plurality of thermal via conductors and the like in addition to the internal wiring, as in the above-mentioned conventional circuit module, however, the internal configuration of the wiring board becomes significantly complicated. Furthermore, both the thermal via conductors and the internal wiring are formed so as not come into contact with each other, so that the position where the thermal via conductor or the internal wiring is formed is restricted. This causes the size of the wiring board to be increased in the conventional circuit module in which the exothermic electronic component is mounted, which makes it difficult to miniaturize the whole configuration of the circuit module.

The embodiment of the present invention provides a circuit module 1 that is small in size and is superior in heat radiation properties.

Figure 9:
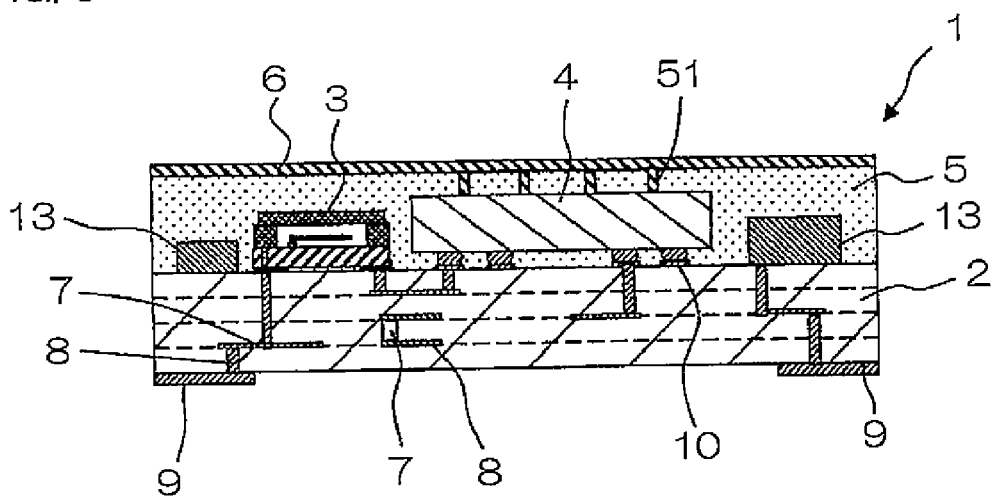
FIG. 9 is a cross-sectional view of a circuit module according to still another embodiment of the present invention.
Figure 10:
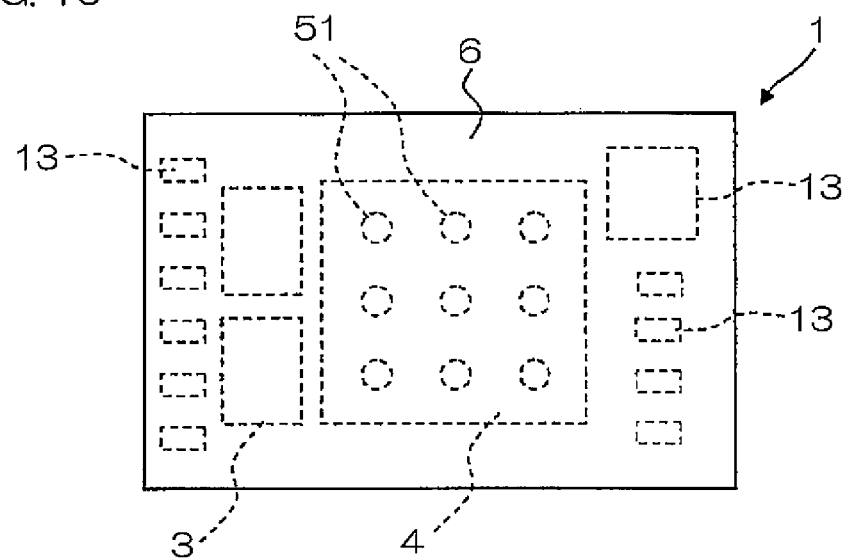
FIG. 10 is a plan view of the circuit module shown in FIG. 9.

FIG. 9 is a cross-sectional view of the circuit module 1 according to the present embodiment. FIG. 10 is a plan view of the circuit module 1 as viewed from above a conductive layer (referred to as a "radiator", paying attention to its heat radiating function in the present embodiment) 6.

A semiconductor component (referred to as an "exothermic electronic component" in the present embodiment) 4, an electronic component 3 with a shielding function (hereinafter merely referred to as an "electronic component") 3, and various electronic components 13 are mounted on a wiring board 2 in the circuit module 1 according to the present embodiment. In FIG. 10, the components 3, 4, and 13 are respectively indicated by dotted lines.

The exothermic electronic component 4 is an electronic component that is relatively high in power consumption and easily generates Joule heat. In the present embodiment, a semiconductor component containing a power amplifier is used.

The exothermic electronic component 4 is disposed at a substantially central position of the radiator 6, as viewed from the top of the circuit module 1, as shown in FIG. 10. Thus arranging the exothermic electronic component 4 causes thermal diffusion properties to be improved, allowing the heat from the exothermic electronic component 4 to be efficiently radiated.

Furthermore, the electronic components 3 and 13 and the exothermic electronic component 4 are covered with an insulating resin portion 5, excluding at least a part of the exothermic electronic component 4.

The insulating resin portion 5 is applied to an upper surface of the wiring board 2 so as to cover the electronic components 3 and 13 and the upper surface of the wiring board 2 by screen printing or the like. The applied insulating resin portion 5 is cured by heating at 150° C. for approximately thirty minutes, for example.

At this time, a part of the exothermic electronic component 4 is not covered with the insulating resin portion 5. This is for connecting the radiator 6 to the exothermic electronic component 4.

In the present embodiment, the insulating resin portion 5 is pattern formed in such a manner that a plurality of paths 51 are provided on the exothermic electronic component 4. That is, a plurality of points on an upper surface of the exothermic electronic component 4 are respectively exposed in the paths 51.

The paths 51 may be formed by forming the insulating resin portion 5 so as to cover the whole exothermic electronic component 4, and then forming a hole and a groove that reach the upper surface of the exothermic electronic component 4 from the upper surface of the insulating resin portion 5 using laser light or the like.

The paths 51 formed on the upper surface of the exothermic electronic component 4 are circular in planar shape and are uniformly arranged over the upper surface of the exothermic electronic component 4, as shown in FIG. 10, for example.

Figure 11:
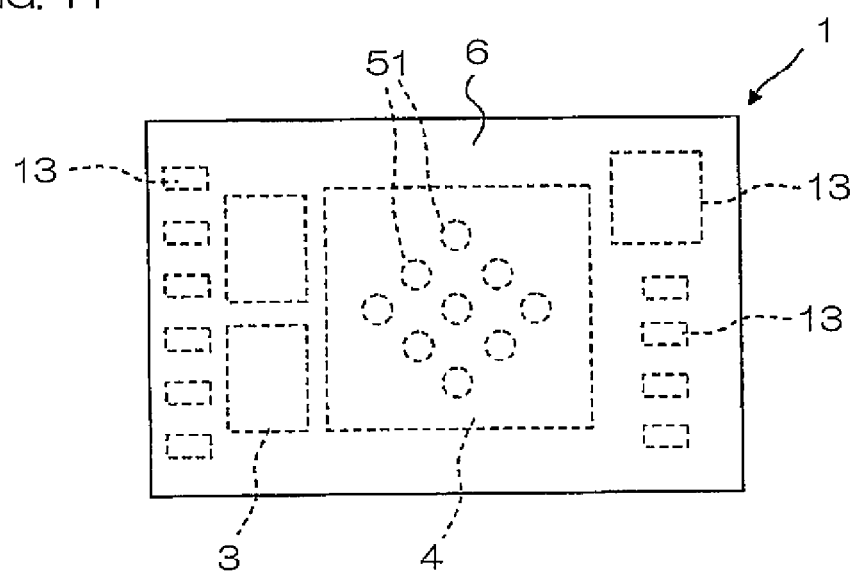
FIG. 11 is a plan view of the circuit module shown in FIG. 9, where the arrangement of paths is changed.
Figure 12:
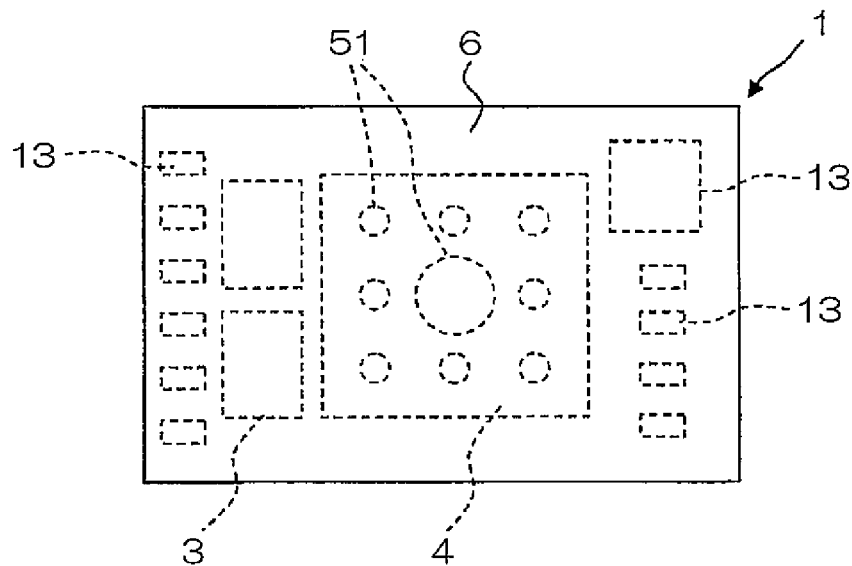
FIG. 12 is a plan view of the circuit module shown in FIG. 9, where the arrangement and the shape of paths are changed.

The shape, the arrangement, and so on of the paths 51 may be changed, as needed. When heat generation temperature distribution is offset in the exothermic electronic component 4, for example, the paths 51 may be formed in only a portion where exothermic temperature easily rises. When the portion where temperature easily rises is positioned at a central region of the exothermic electronic component 4, the paths 51 may be closely-spaced in the central region of the exothermic electronic component 4, as shown in FIG. 11, or the path 51 positioned at the center of the exothermic electronic component 4 increases in planar shape, as shown in FIG. 12. Thus providing a heat radiation structure on the upper surface of the exothermic electronic component 4 allows the formation density, the formation dimensions, and so on of the paths 51 to be changed in conformity with the exothermic temperature distribution in the exothermic electronic component 4 such that generated heat is efficiently radiated. This allows the electrical performance and the reliability performance of the circuit module 1 to be further improved. Note that the paths 51 can have any planar shape such as a polygonal shape or a striped shape.

The upper surface of the insulating resin portion 5 is covered with the radiator 6. When the upper surface of the insulating resin portion 5 is covered with the radiator 6, the paths 51 are filled with a material composing the radiator 6. Thus, the upper surface of the exothermic electronic component 4 exposed to respective bottom surfaces of the paths 51 is thermally connected to the radiator 6.

Examples of a material for the radiator 6 include conductive resin and metal films formed by evaporation and plating, as in the above-mentioned embodiments. The materials are high in thermal conductivity. Particularly, it is preferable that the radiator 6 is formed of a metal sintered body composed of only sintered metal particles such as Ag from the viewpoint of productivity. When the circuit module 1 is incorporated into a cellular phone or the like that handles a radio frequency of not less than 800 MHz, the metal sintered body is also particularly effective from the viewpoint of electromagnetic shielding.

The metal sintered body contains few resin components such as binders and is obtained by sintering metallic fine particles. The metal sintered body is formed by dispersing metal nano particles having an average particle diameter of 1 nm to 100 nm and more suitably an average particle diameter of 10 nm to 50 nm in an organic-based dispersion solvent such as toluene, terpineol, xylen, or tetradecane, bringing the particles into a paste, and then applying the paste to the upper surface of the insulating resin portion 5, followed by heating at 130 to 300° C. By thus using the metal particles on the nano order, a dense metal layer is formed, which is significantly superior in thermal conductivity and heat radiation properties. Therefore, heat generated from the exothermic electronic component 4 can be efficiently radiated outward. Furthermore, the metal particles on the nano order are sintered at a relatively low temperature of 130 to 300° C. Therefore, the radiator 6 can be formed without degrading the insulating resin portion 5, the electronic components 3 and 13, and so on by high-temperature heating.

Note that Cu, Ni, or the like can be used in addition to Ag as a material for the metal sintered body. Furthermore, the thickness of the radiator 6 formed of the metal sintered body is set to 5 to 10 μm, for example.

In the above-mentioned circuit module 1 according to the present invention, much of heat generated from the exothermic electronic component 4 is radiated outward through the material with which the paths 51 are filled. That is, the heat generated from the exothermic electronic component 4 can be easily radiated outward without providing a complicated heat radiation structure composed of thermal via conductors or the like in the wiring board 2. Therefore, the internal configuration of the wiring board 2 is simplified while the degree of design freedom of the internal wiring can be improved. This allows the wiring board 2 to be miniaturized, and thus allows the whole configuration of the circuit module 1 to be miniaturized.

Figure 13:
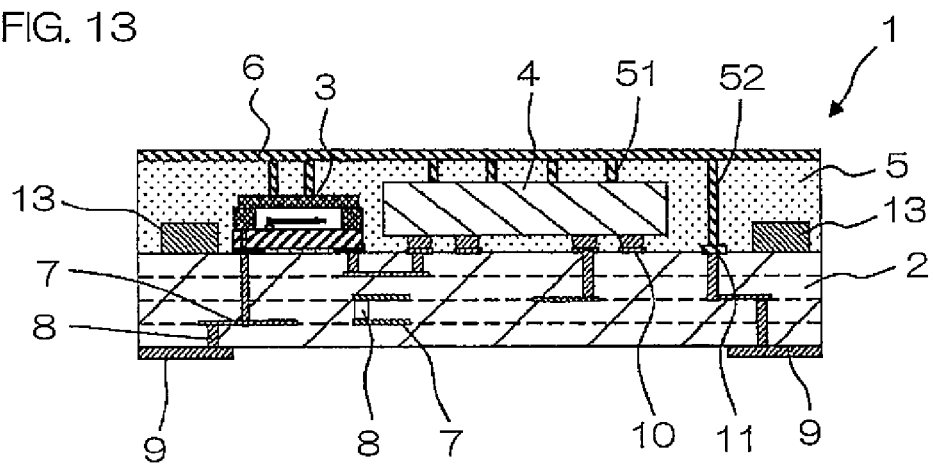
FIG. 13 is a cross-sectional view of a circuit module according to still another embodiment of the present invention.

FIG. 13 is a cross-sectional view showing a modified example of the present embodiment. A characteristic of a circuit module 1 shown in FIG. 13 is that a path 52 penetrating an insulating resin portion 5 from its upper surface to a wiring board 2 is formed. A radiator 6 formed on the upper surface of the insulating resin portion 5 is electrically connected to a conductor 11 for a reference potential (hereinafter referred to as a ground conductor 11) provided in the wiring board 2 through a conductive material with which the path 52 is filled. The ground conductor 11 is a conductor held at a ground potential when the circuit module 1 is employed, and is connected to an external terminal 9 for a ground potential through internal wiring.

An electromagnetic shielding function of the radiator 6 can be enhanced by electrically connecting the radiator 6 to the ground conductor 11. This causes the exothermic electronic component 4 and the electronic components 3 and 13 that are mounted on the wiring board 2 to be electromagnetically shielded, which can prevent a malfunction of the electronic component due to unnecessary electromagnetic waves from the exterior, variations in electrical characteristics, and so on, allowing the circuit module 1 to be more stably operated.

Note that the radiator 6 can be also reduced to a ground potential by forming a conductor pattern on a side surface of the insulating resin portion 5, and connecting the conductor pattern and the radiator 6 to each other while connecting the conductor pattern and the ground conductor 11 (or the external terminal 9) to each other instead of forming the path 52 in the insulating resin portion 5 by penetration.

Figure 14:
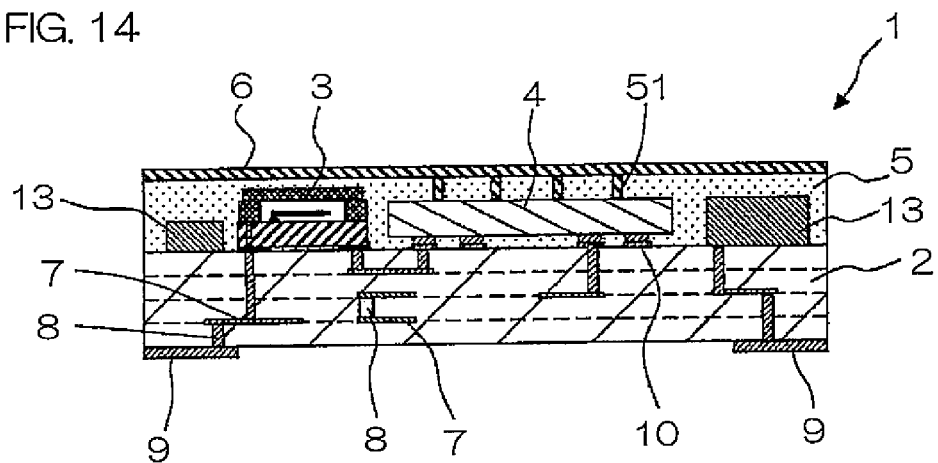
FIG. 14 is a cross-sectional view of a circuit module according to still another embodiment of the present invention.

Although in the above-mentioned embodiment, description was made using an example of the circuit module 1 in which the height position of the upper surface of the exothermic electronic component 4 is the highest of the height positions of the upper surfaces of the plurality of electronic components 3, 4, and 13, the present invention is also applicable to a case where the height position of the upper surface of the exothermic electronic component 4 is lower than the respective height positions of the upper surfaces of the other electronic components 3 and 13. In this case, paths 51 having a height corresponding to spacing between the radiator 6 and the exothermic electronic component 4 may be formed, as shown in FIG. 14, and filled with a material for the radiator 6.

Figure 15:
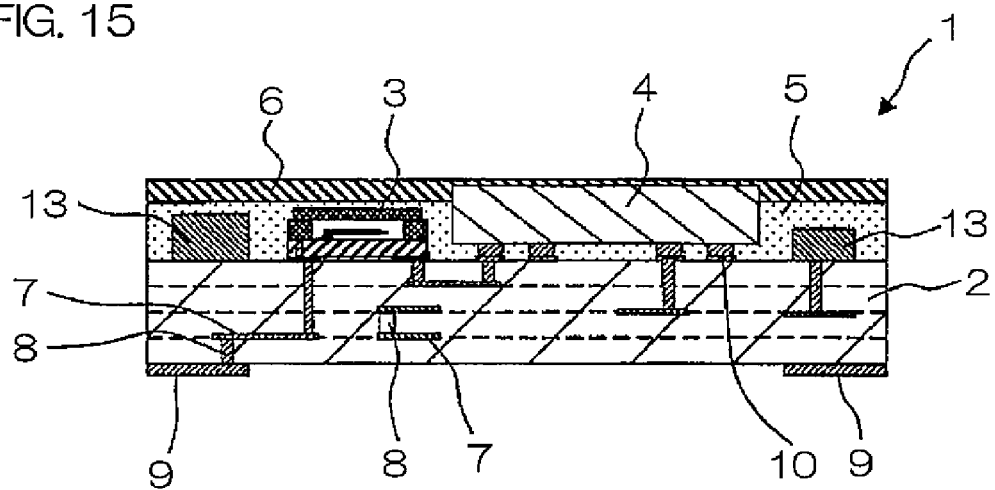
FIG. 15 is a cross-sectional view of a circuit module according to still another embodiment of the present invention.

FIG. 15 is a cross-sectional view showing another embodiment of the circuit module 1 according to the present invention. The same constituent elements as those in the above-mentioned embodiment are assigned the same reference numerals and hence, the overlapped description is omitted.

A characteristic of the present embodiment is that an upper part of an exothermic electronic component 4 is buried in a radiator 6. Thus burying the upper part of the exothermic electronic component 4 in the radiator 6 causes the contact area between the exothermic electronic component 4 and the radiator 6 to be increased, allowing heat generated by the exothermic electronic component 4 to be more efficiently radiated outward. Note that the upper part of the exothermic electronic component 4 is an upper half region in a main body of the exothermic electronic component 4.

Figure 16:
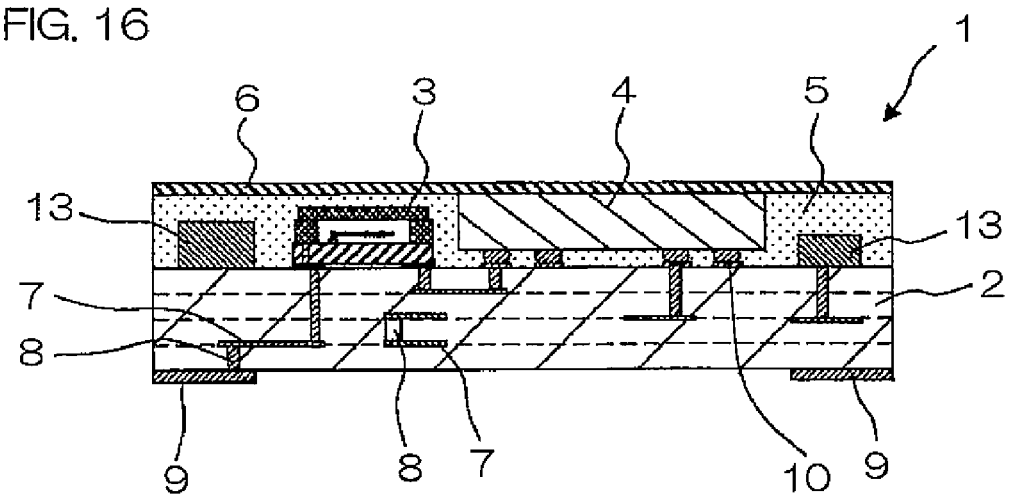
FIG. 16 is a cross-sectional view of a circuit module according to still another embodiment of the present invention.

FIG. 16 is a cross-sectional view showing another embodiment of the circuit module 1 according to the present invention.

A characteristic of the present embodiment is that the height position of an upper surface of an exothermic electronic component 4 is higher than the respective height positions of upper surfaces of other electronic components 3 and 13, and the height position of an upper surface of an insulating resin portion 5 is equal to the height position of the upper surface of the exothermic electronic component 4.

Making the height position of the upper surface of the insulating resin portion 5 and the height position of the upper surface of the exothermic electronic component 4 equal to each other allows the height of the circuit module 1 to be reduced while flattening an upper surface of a radiator 6. That is, in a case where the upper surface of the insulating resin portion 5 is lower than the upper surface of the highest exothermic electronic component 3, when the radiator 6 is formed so as to cover the upper surface of the insulating resin portion 5, the radiator 6 enters a state where its portion corresponding to the exothermic electronic component 4 projects. On the other hand, if the height position of the upper surface of the insulating resin portion 5 and the height position of the upper surface of the exothermic electronic component 4 are made equal to each other, large irregularities are not formed in the radiator 6 formed on the insulating resin portion 5. When the circuit module 1 is conveyed by suction, for example, therefore, the suction can be reliably applied, which can be used to improve productivity. Furthermore, the insulating resin portion 5 is not interposed between the upper surface of the exothermic electronic component 4 and the radiator 6. This allows the height of the circuit module 1 to be reduced.

Figure 17:
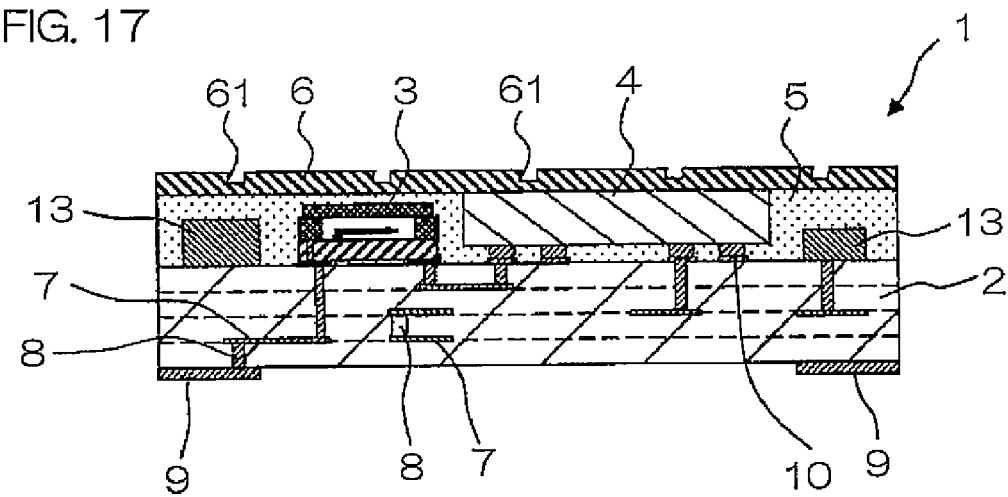
FIG. 17 is a cross-sectional view of a circuit module according to still another embodiment of the present invention.

FIG. 17 is a cross-sectional view showing still another embodiment of the circuit module 1 according to the present invention. A characteristic of the present embodiment is that a radiator 6 is provided with a plurality of grooves 61. Thus providing the radiator 6 with the plurality of grooves 61 causes the surface area of the radiator 6 to be increased, allowing heat radiation properties to the exterior to be enhanced. The plurality of grooves 61 may have any planar shape, for example, a linear shape or a curved shape.

Description is then made of a circuit module 1 using two semiconductor components as an electronic component. An RFIC and a baseband IC are respectively used as the first semiconductor component and the second semiconductor component.

Figure 18:
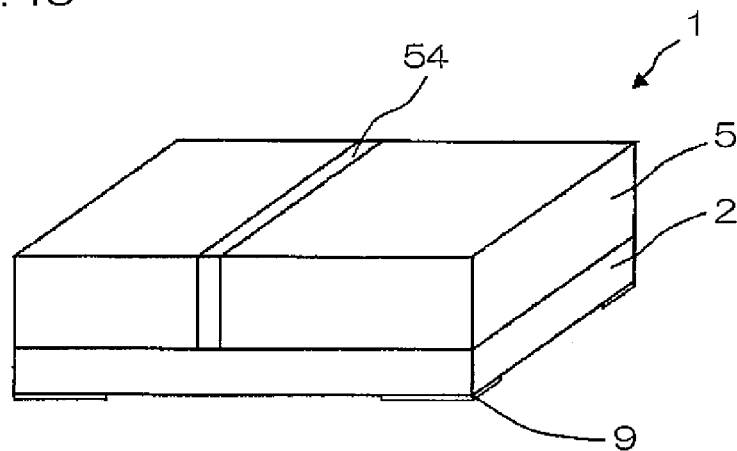
FIG. 18 is a perspective view of a circuit module according to still another embodiment of the present invention.
Figure 19:
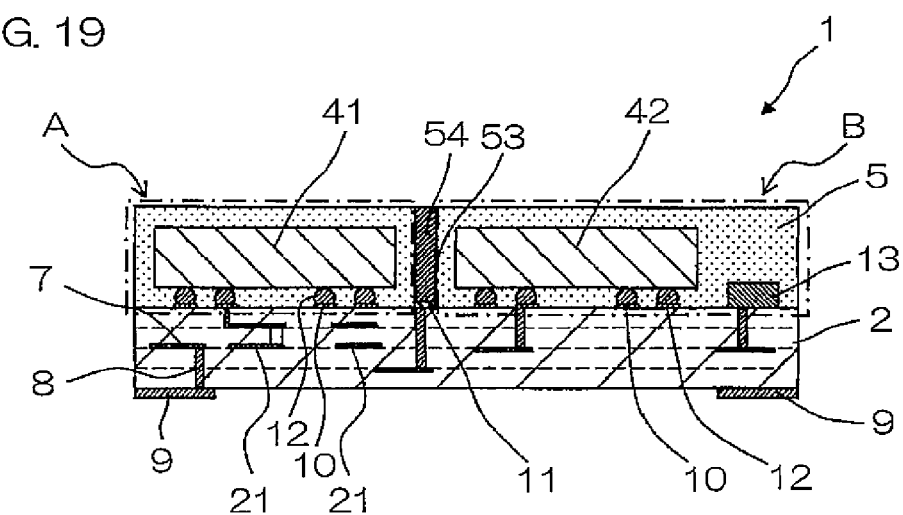
FIG. 19 is a cross-sectional view of the circuit module shown in FIG. 18.
Figure 20:
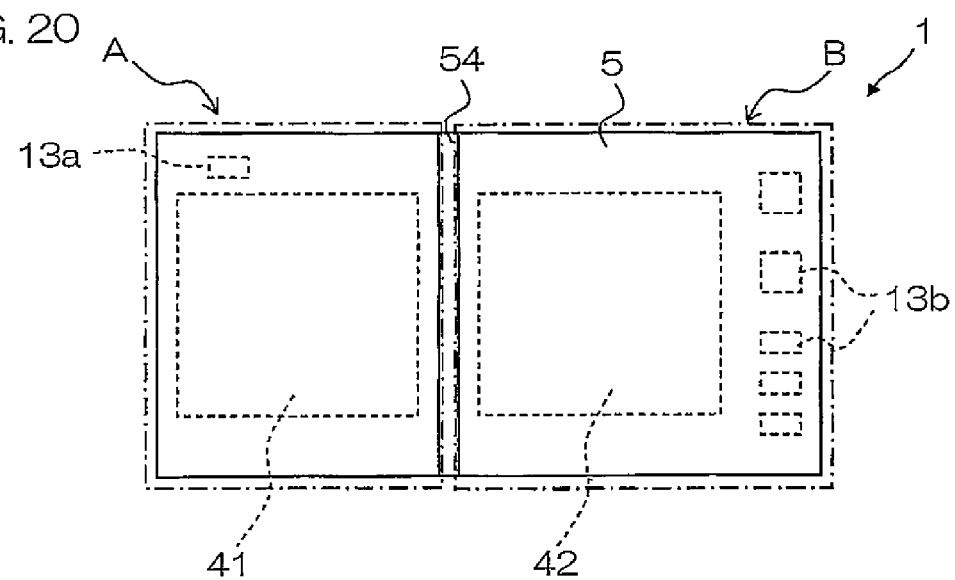
FIG. 20 is a plan view of the circuit module shown in FIG. 18.

FIG. 18 is a perspective view of the appearance of the circuit module 1 according to the embodiment of the present invention, FIG. 19 is a cross-sectional view of the circuit module 1 shown in FIG. 18, and FIG. 20 is a plan view of the circuit module 1 shown in FIG. 18.

The circuit module 1 is mainly composed of a wiring board 2, a first semiconductor component 41, a second semiconductor component 42, an insulating resin portion 5 that covers the first and second semiconductor components 41 and 42 and a shielding member 54 that separates both the first semiconductor component 41 and the second semiconductor component 42.

The first semiconductor component 41 mounted on the wiring board 2 is an RFIC, and includes an RF receiving circuit that amplifies and frequency-converts a signal received by an antenna (ANT) and outputs a demodulation signal to the baseband IC and an RF transmission circuit that frequency-converts a signal from the baseband IC and outputs the frequency-converted signal to the antenna. The first semiconductor component 41 is a semiconductor component containing a power amplifier and serving as a generation source of unnecessary electromagnetic waves. The first semiconductor component 41 is a flip-chip type IC, has a configuration in which circuit wiring composed of Al or the like is formed on a surface of a semiconductor component board composed of Si, GaAs or the like, and is electrically and mechanically connected to an electrode pad 10 in a bump 12 composed of Au or the like.

The second semiconductor component 42 is a baseband IC, and has the function of demodulating and modulating a sound signal and an RF signal, for example. The second semiconductor component 42 is a flip-chip type IC, similarly to the first semiconductor component 41, has a configuration in which circuit wiring composed of Al or the like is formed on a surface of a semiconductor component board composed of Si, GaAs or the like, and is electrically and mechanically connected to the electrode pad 10 in the bump 12 composed of Au or the like.

A region where the first semiconductor component 41 is disposed and a region where the second semiconductor component 42 is disposed are respectively referred to as a region A and a region B.

Various electronic components 13 are also mounted in addition to the first and second semiconductor components on an upper surface of the wiring board 1. The electronic components 13 include a crystal oscillator, an SAW filter, a capacitor, a resistor, an inductor, and so on, and are divided into control-based electronic components electrically connected to the baseband IC and RF-based electronic components electrically connected to the RFIC. The various electronic components 13 are chip components, and their respective external terminals and electrode patterns are electrically and mechanically connected to each other by conductive jointing materials such as solders.

Furthermore, passive components 21 such as a capacitor, a balun, and a filter are contained in the wiring board 1. Thus containing the passive components 21 in the wiring board 2 allows the wiring board 2 to be reduced, and thus allows the whole configuration of the circuit module 1 to be miniaturized.

The first and second semiconductor components 41 and 42 and the various electronic components 13 are covered with the insulating resin portion 5. The insulating resin portion 5 is composed of a resin material such as phenol resin or epoxy resin, and covers the first and second semiconductor components 41 and 42 and the various electronic components 13, to protect the first and second semiconductor components 41 and 42 and the various electronic components 13 while enhancing the mechanical strength of the circuit module 1 itself to ensure the reliability performance thereof.

The insulating resin portion 5 is formed by first applying an insulating resin paste to the upper surface of the wiring board 2 so as to cover the first and second semiconductor components 41 and 42 and the various electronic components 13 by screen printing or the like, followed by heating and curing at 150° C. for approximately thirty minutes, for example. At this time, the insulating resin portion 5 is also formed between the first semiconductor component 41 and the second semiconductor component 42.

A groove 53 that separates the first semiconductor component 41 and the second semiconductor component 42 is formed in the insulating resin portion 5 formed between the first semiconductor component 41 and the second semiconductor component 42. Here, the groove 53 is a portion from which the insulating resin portion 5 formed by laser processing or the like is removed, and its cross-sectional shape is a recess, as shown in FIG. 19. The recess may be to a depth of the middle of the insulating resin portion 5, or a bottom surface of the recess may reach the wiring board 2 after penetrating the insulating resin portion 5.

The groove 53 provided in the insulating resin portion 5 is filled with a conductive member, to form a shielding member 54. The shielding member 54 separates the first semiconductor component 41 and the second semiconductor component 42, which can inhibit unnecessary electromagnetic waves from being propagated between the first semiconductor component 41 and the second semiconductor component 42. This prevents the second semiconductor component 42 from being directly exposed to unnecessary electromagnetic waves generated from a power amplifier contained in the first semiconductor component 41, for example, allowing the operation of the circuit module 1 to be stabilized.

Furthermore, it is preferable that out of the various electronic components 13 other than the first and second semiconductor components 41 and 42, the electronic component 13a for RF and the control-based electronic component 13b are respectively arranged in the region A where the RFIC is disposed and the region B where the baseband IC is disposed, as shown in FIG. 20. This inhibits the interference of signals between the RF-based electronic component including the RFIC and the control-based electronic component including the baseband IC, allowing the circuit module 1 to be more stably operated.

Furthermore, the shielding member 54 is connected to a ground conductor 11 on the wiring board 2. The ground conductor 11 is connected to an external terminal 9 for grounding provided on a lower surface of the wiring board 2, and is held at a ground potential when the circuit module 1 is employed. The shielding member 54 having conductive properties connected to the ground conductor 11 is also held at the ground potential. By thus providing the ground conductor 11 held at the ground potential and connecting the shielding member 54 to the ground conductor 11, the effect of shielding electromagnetic waves between the first semiconductor component 41 and the second semiconductor component 42 can be enhanced.

In connecting the shielding member 54 and the ground conductor 11, they are directly joined to each other without using adhesives, a solder, or the like, which allows the circuit module 1 to be miniaturized while allowing connection that is reliable and is superior in reliability without requiring an extra space for filet formation.

Exemplified as a material for the shielding member 54 can be conventionally well-known conductive resin materials and metal films formed by evaporation and plating. However, it is preferable that the shielding member 54 is formed of a metal sintered layer composed of only sintered metal particles such as Ag from the viewpoint of productivity.

Particularly when the circuit module 1 is incorporated into radio communications equipment that handles a frequency of not less than 800 MHz, the metal sintered layer is particularly effective. Preferable as the metal sintered layer is one that contains few resin components such as binders and is obtained by sintering metallic fine particles. The metal sintered layer is formed by dispersing metal nano particles having an average particle diameter of 1 nm to 100 nm and more suitably an average particle diameter of 10 nm to 50 nm in an organic-based dispersion solvent such as toluene, terpineol, xylen, or tetradecane, bringing the particles into a paste, and then filling the groove 53 provided between the first semiconductor component 41 and the second semiconductor component 42 with the paste, followed by heating at 130 to 300° C. and more preferably 150° C. to 250° C. At this time, the dispersion solvent is evaporated while the metal particles are sintered, to form the shielding member 54. Thus using the metal particles on the nano order causes a dense metal layer to be formed, allowing electromagnetic noises from the first semiconductor component 41 to be effectively shielded. Furthermore, the metal particles on the nano order are sintered at a relatively low temperature of 130 to 300° C., which can inhibit the insulating resin portion 5, the first and second semiconductor components 41 and 42, and so on from being degraded by high-temperature heating. The metal sintered layer may be mainly composed of a metal other than Ag, for example, Cu or Ni. Furthermore, the thickness of the shielding member 54 composed of the metal sintered layer can be set to 20 μm to 100 μm, for example, and the shielding member 54 can be made thinner than a plate-shaped member composed of a metal, which is also favorable to miniaturize the circuit module 1.

Furthermore, sintering occurs due to direct contact between the shielding member 54 and the ground conductor 11 on the wiring board 2 by applying, filling, and sintering the metal particles by the above-mentioned heating such that the shielding member 54 comes into contact with the ground conductor 11. As a result, the shielding member 54 and the ground conductor 11 are firmly joined to each other.

According to the above-mentioned circuit module 1, an area between the first semiconductor component 41 and the second semiconductor component 42 is filled with the insulating resin portion 5 such that the groove 53 that separates both the semiconductor components is formed while the shielding member 54 having conductive properties is provided in the groove 53, which allows the shielding member 54 that separates the first and second semiconductor components to be formed therebetween without using a metal cover, and can be used to miniaturize the circuit module 1.

Furthermore, the first and second semiconductor components 41 and 42 and the various electronic components 13 that are mounted on the upper surface of the wiring board are covered with the insulating resin portion 5, and the shielding member 54 is buried in the groove 53 provided in the insulating resin portion 5. Therefore, the shielding member 54 that shields the first semiconductor component 41 and the second semiconductor component 42 can be formed in a good condition without damaging the electronic components and the shielding member 54.

Furthermore, the necessity of providing a ceiling plate for holding a shielding plate as in a conventional metal cover is eliminated. Furthermore, the shielding member 54 that separates the RF-based electronic component and the control-based electronic component is provided in the longitudinal direction, which allows the inside of the wiring board 2 to be effectively utilized as a region where wiring is pulled or a contained component is formed so that the degree of design freedom is made higher while the height of the circuit module 1 can be made smaller, as compared with those in a case where a solid ground pattern extending in the transverse direction is provided in the wiring board 2.

Figure 21:
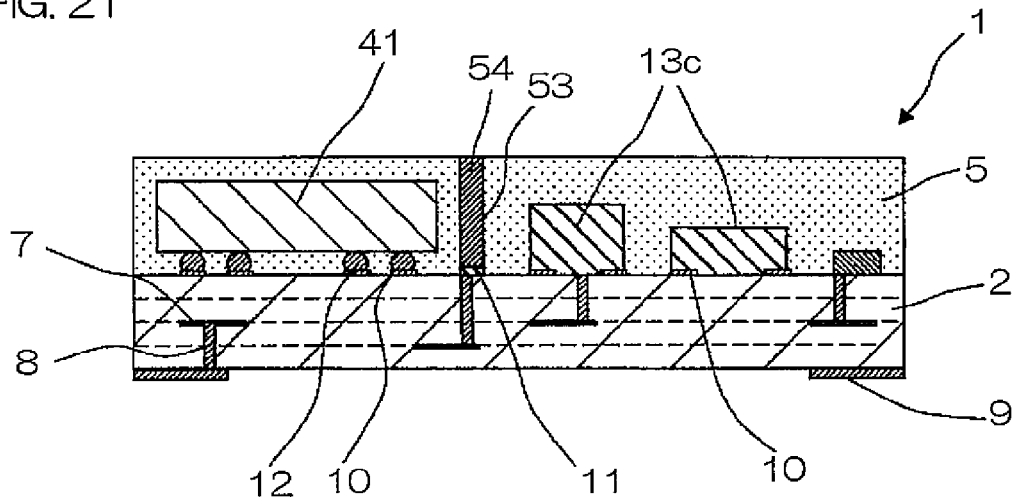
FIG. 21 is a cross-sectional view of a circuit module according to still another embodiment of the present invention.

Although in the above-mentioned embodiment, description was made of an example in which both the first and second semiconductor components 41 and 42 are composed of an IC, the present invention is applicable to a circuit module 1 obtained by providing a plurality of electronic components including an electronic component that can generate an electromagnetic noise side by side in a wiring board. For example, a shielding member 54 may be provided between a first semiconductor component 41 and an electronic component 13c whose characteristics easily vary by temperature, for example, a crystal oscillator or an SAW filter, as shown in FIG. 21.

Figure 22:
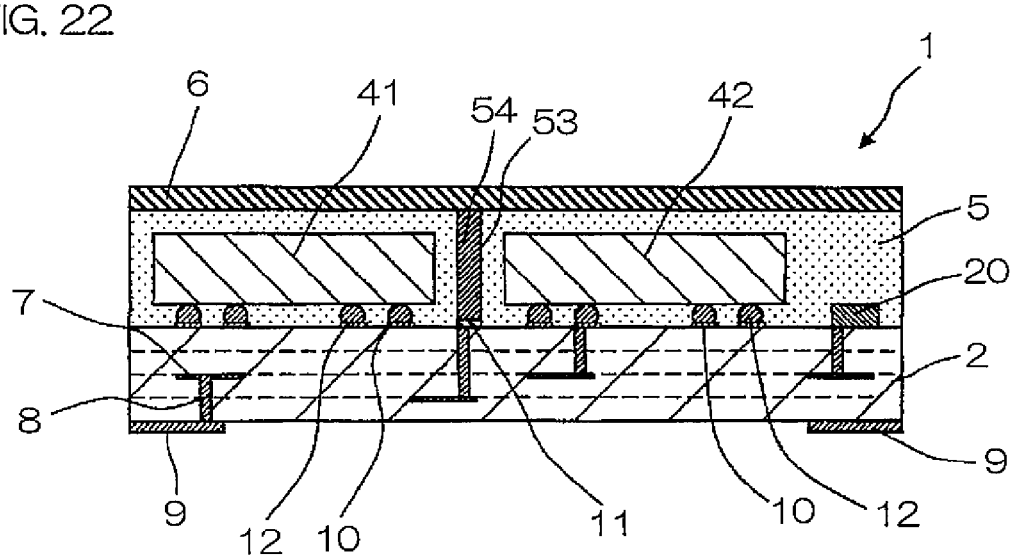
FIG. 22 is a cross-sectional view of a circuit module according to still another embodiment of the present invention.

FIG. 22 is a cross-sectional view of a circuit module 1 showing another embodiment of the present invention. A characteristics of the circuit module 1 is that a conductive layer 6 connected to a shielding member 54 is provided on an upper surface of an insulating resin portion 5. Such a configuration causes the upper surface of the insulating resin portion 5 to be covered with the conductive layer 6 held at a ground potential throughout, allowing the operation of the circuit module 1 to be stabilized by shielding unnecessary electromagnetic waves from the exterior. Furthermore, unnecessary electromagnetic waves radiated from a first semiconductor component 41 can be prevented from leaking out of the circuit module 1.

Furthermore, the conductive layer 6 also has the function of assisting in radiating heat generated from the first semiconductor component 41 and transmitted to the shielding member 54. This makes it difficult for heat to be stored, which prevents the electrical characteristics of a second semiconductor component 42 from varying by heat, allowing the circuit module 1 to be more stably operated.

It is preferable that the conductive layer 6 is formed of the same material as the shielding member 54. Specifically, the conductive layer 6 is formed by dispersing metal nano particles having an average particle diameter of 1 nm to 100 nm and more suitably an average particle diameter of 10 nm to 50 nm in an organic-based dispersion solvent such as toluene, terpineol, xylen, or tetradecane, bringing the particles into a paste, and then applying the paste to the upper surface of the insulating resin portion 5, followed by heating at 130 to 300° C. and more preferably 150° C. to 250° C.

By thus forming the conductive layer 6 using the same material as the shielding member 54, connection between the conductive layer 6 and the shielding member 54 can be reliably made while the conductive layer 6 and the shielding member 54 can be formed in the same process so that the production efficiency is very high. Note that the thickness of the conductive layer 6 is set to 5 to 10 μm, for example.

Figure 23:
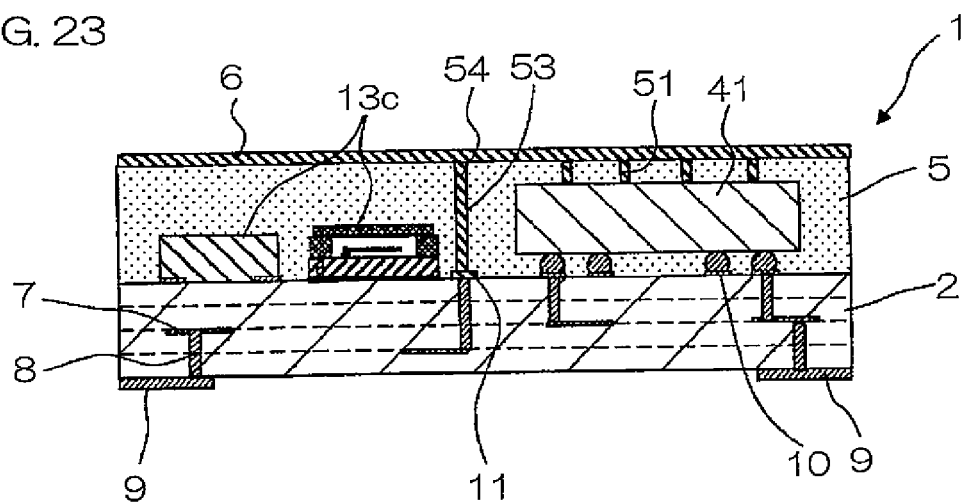
FIG. 23 is a cross-sectional view of a circuit module according to still another embodiment of the present invention.
Figure 24:
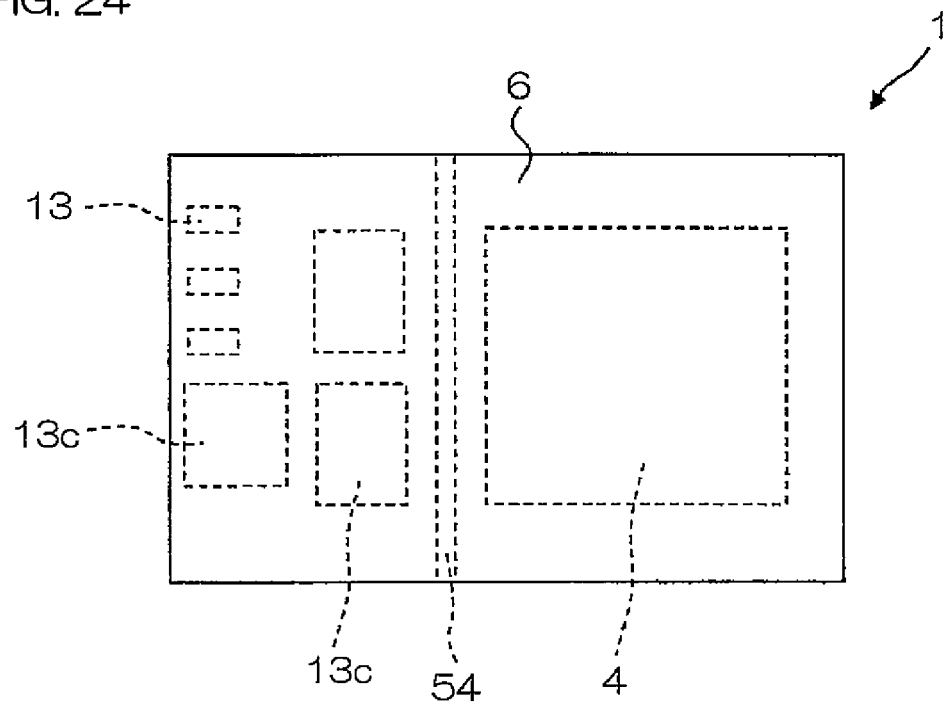
FIG. 24 is a plan view of the circuit module shown in FIG. 23.

FIG. 23 is a cross-sectional view showing another embodiment of the circuit module 1 according to the present invention, and FIG. 24 is a plan view thereof.

A characteristic of the present embodiment is that an electronic component 13c (including an electronic component 3 with a shielding function) whose characteristics easily vary by temperature, for example, a crystal oscillator, a crystal vibrator, or an SAW filter is set up in place of the second semiconductor component 42.

There is provided between a first semiconductor component 41 and the electronic component 13c a shielding member that separates both the components. The shielding member 54 is connected to a radiator 6, so that heat generated from the first semiconductor component 41 is allowed to escape to the radiator 6. This can inhibit the heat from being transmitted to the electronic component 13c that greatly varies in temperature characteristics, to prevent the electrical characteristics of the electronic component 13c from varying, allowing the circuit module 1 to be stably operated.

Figure 25:
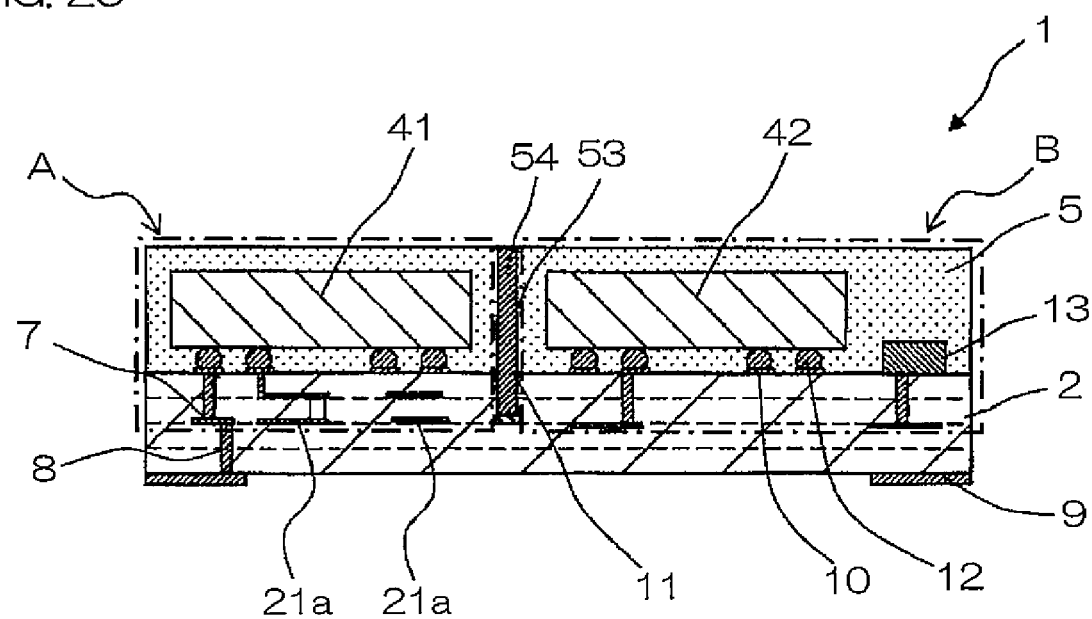
FIG. 25 is a cross-sectional view of a circuit module according to still another embodiment of the present invention.

FIG. 25 is a cross-sectional view of a circuit module 1 showing still another embodiment of the present invention.

A characteristic of the circuit module 1 shown in FIG. 25 is that a bottom surface of a groove 53 is positioned in a wiring board. This causes each of two regions A and B separated by a shielding member 54 to extend into the wiring board. This allows the interference of signals between a RF-based component and a control-based component to be further reduced by containing a passive component 21 for RF in the wiring board and arranging the passive component 21a in the area A, allowing the operation of the circuit module 1 to be stabilized while miniaturizing the whole configuration of the circuit module 1. Furthermore, the shielding member 54 that separates the RF-based component and the control-based component is provided in the longitudinal direction (a top-and-bottom direction of paper), which allows the inside of the wiring board 2 to be more effectively utilized as a region where wiring is pulled or a contained component is formed so that the degree of design freedom is made higher, as compared with those in a case where the shielding member is horizontally provided in the wiring board 2.

Figure 26:
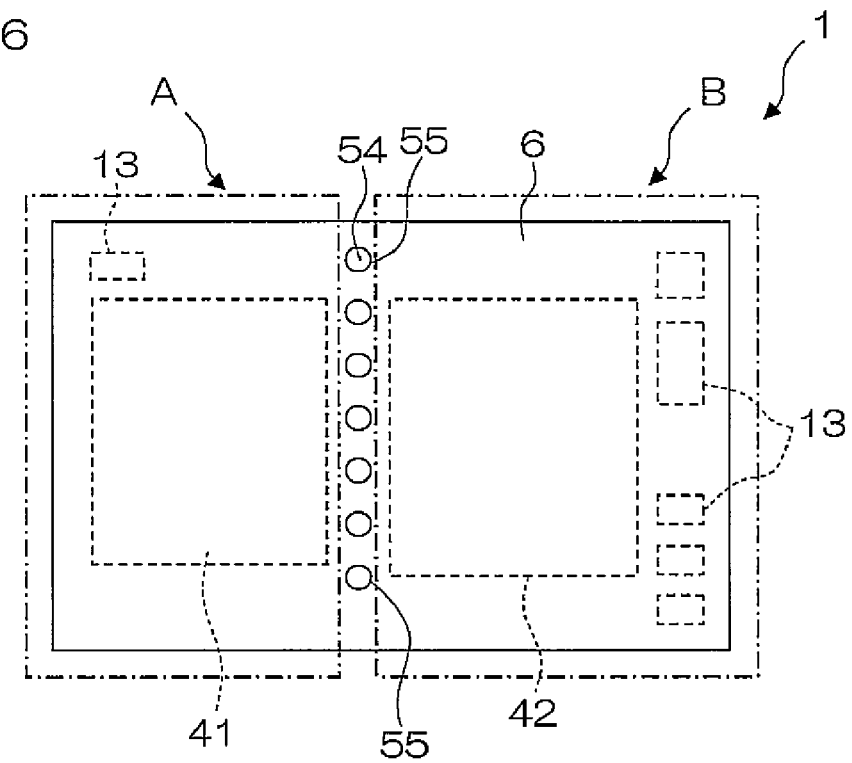
FIG. 26 is a plan view of a circuit module according to still another embodiment of the present invention.

FIG. 26 is a plan view of a circuit module 1 according to still another embodiment of the present invention.

A characteristic of the present invention is that a plurality of holes 55 for separating a first semiconductor component 41 and a second semiconductor component 42 are formed with predetermined spacing in an insulating resin portion 5 formed between the first and second semiconductor components 41 and 42. Examples of a method for forming the holds 55 include a method for providing a cavity in the insulating resin portion 5 by a laser spot. The plurality of holds 55 may be to a depth of the middle of the insulating resin portion 5, or a bottom surface of the recess may reach the wiring board 2 after penetrating the insulating resin portion 5.

The holes 55 provided in the insulating resin portion 5 are filled with a shielding member 54 having conductive properties. The shielding member 54 electromagnetically separates the first semiconductor component 41 and the second semiconductor component 42, which can inhibit unnecessary electromagnetic waves from being propagated between the first and second semiconductor components 41 and 42. This prevents the second semiconductor component 42 from being directly exposed to unnecessary electromagnetic waves generated from a power amplifier contained in the first semiconductor component 41, for example, allowing the operation of the circuit module 1 to be stabilized.

<Radio Communications Equipment>

Figure 27:
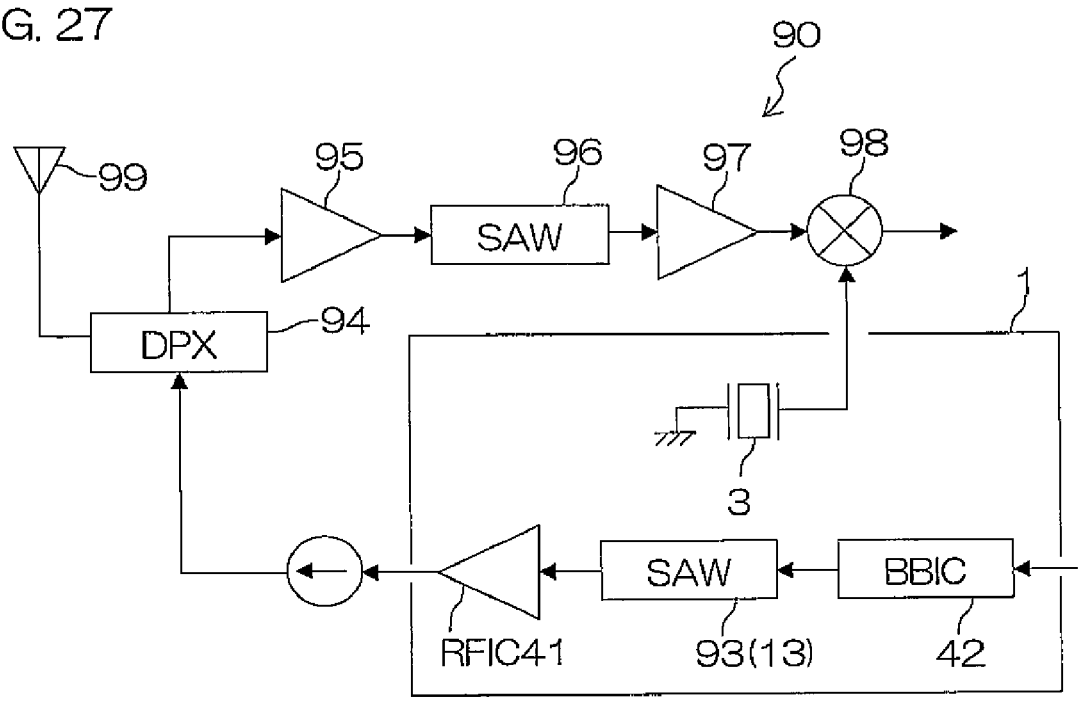
FIG. 27 is a block diagram showing radio communications equipment in which the circuit module according to the present invention is incorporated.

FIG. 27 is a block diagram showing a circuit configuration of radio communications equipment including the circuit module 1 according to the present invention, and a duplexer 94, an antenna 99, and a receiving circuit 90 that are connected to the circuit module 1. Exemplified as the applications of such radio communications equipment can be a cellular phone.

The circuit module 1 mounted on the radio communications equipment includes a baseband IC serving as a second semiconductor component 42, an SAW band-pass filter 93 (one type of electronic component 13) that passes a baseband signal outputted from the baseband IC and removes an unnecessary signal component, an RFIC including a high-frequency power amplifier serving as a first semiconductor component 41, and an electronic component 3 with a shielding function such as a crystal vibrator or an SAW filter. The components are mounted on a wiring board.

The receiving circuit 90 includes a low noise amplifier 95 that amplifies a signal that has passed through a duplexer 94, an SAW band-pass filter 96 for removing its unnecessary signal component, an amplifier 97 that amplifies a signal that has passed through the SAW band-pass filter 96, a mixer 98 that converts the signal amplified by the amplifier 97 into a low-frequency signal, and so on.

In the radio communications equipment, the baseband signal outputted form the baseband IC is converted into a high-frequency power signal in an RFIC after passing through the SAW band-pass filter 93. The high-frequency power signal is radiated from the antenna 99 after passing through the duplexer 94. On the other hand, a signal received by the antenna 99 is amplified by the low-noise amplifier 95, and its unnecessary signal component is removed by the SAW band-pass filter 96. A signal that has passed through the SAW band-pass filter 96 is amplified again by the amplifier 97, and is frequency-converted into a baseband signal by the mixer 98.

Thus applying the circuit module 1 that is small in size and superior in productivity according to the present invention to the radio communications equipment makes small-sized/low-cost and high-performance radio communications equipment feasible.

<Manufacturing Method 1>

A method for manufacturing a circuit module 1 according to the above-mentioned embodiments (FIGS. 1 to 8) will be described using FIGS. 28(*a*) to 28(*e*).

(Process A)

Figure 28:
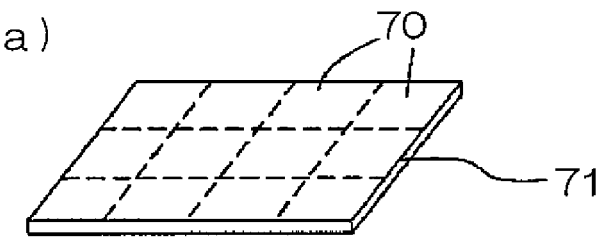
FIGS. 28(a) to 28(e) are diagrams for explaining the steps of manufacturing a circuit module according to an embodiment of the present invention.
Figure 28:
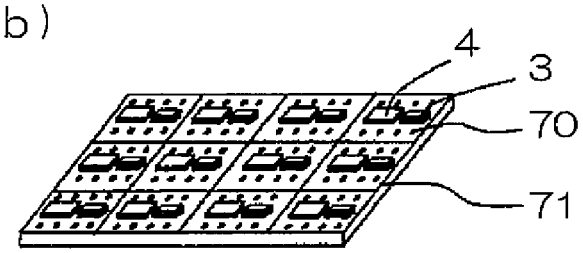
Figure 28:
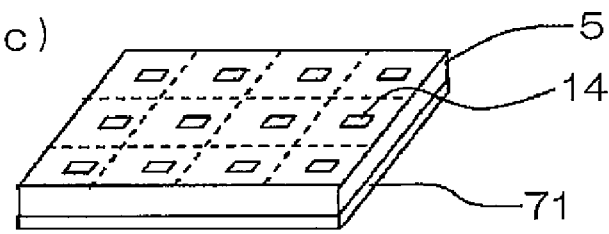
Figure 28:
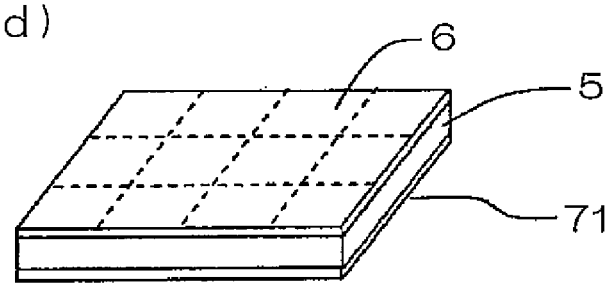
Figure 28:
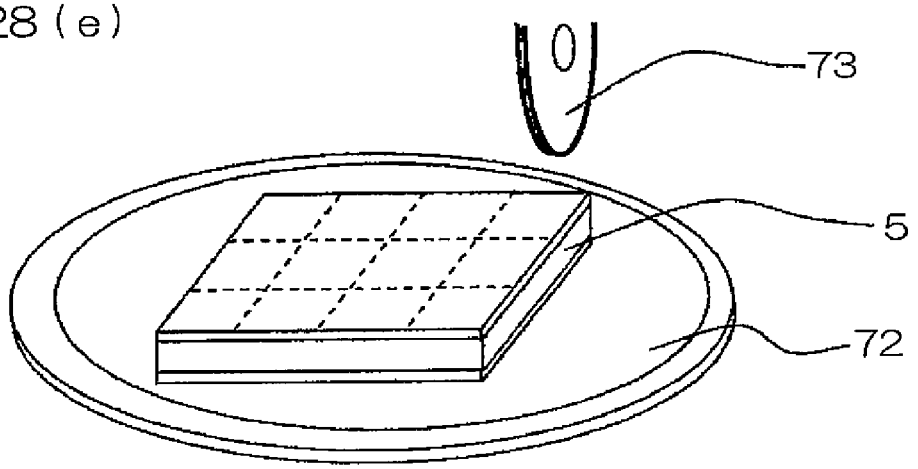

First, a master board 71 having a plurality of board regions 70 arranged in a matrix shape is prepared, as shown in FIG. 28(*a*).

The master board 71 is configured by laminating green sheets each composed of a ceramic material such as glass-ceramic and alumina ceramics, for example. An electrode pad, internal wiring, a via hole conductor, an external terminal, and so on are formed on a surface of and inside of each of the board regions 70.

The master board 71 is produced by printing and applying a conductive paste serving as an electrode pad or an external terminal in a predetermined pattern on a surface or the like of a ceramic green sheet obtained by adding and mixing a suitable organic solvent or the like to and with ceramic material powder composed of alumina ceramics or the like, laminating a plurality of ceramic green sheets, and press-molding an obtained laminate, followed by calcination at high temperature, for example.

(Process B)

Then, an electronic component 3 with a shielding function, a semiconductor component 4, and various electronic components 13 such as a capacitor, a resistor, and an inductor are mounted with a conductive jointing material such as a solder on an electrode pad of each of the board regions 70, as shown in FIG. 28(*b*). In this state, an upper surface of the electronic component 3 with a shielding function is higher than respective upper surfaces of the semiconductor component 4 and the electronic components 13. In the present embodiment, a temperature compensated crystal oscillator including a container 20 and a metal plate 14 fastened to an upper surface of the container 20 is used as the electronic component 3 with a shielding function.

(Process C)

Then, a resin paste serving as an insulating resin portion 5 is printed so as to cover the respective upper surfaces of the electronic component 3 with a shielding function, the semiconductor component 4, the various electronic components 13, and the board regions 70 that are mounted on the collected wiring board, followed by curing, as shown in FIG. 28(*c*).

At this time, a portion, which is held at a reference potential, of the electronic component 3 with a shielding function, that is, an upper surface of the metal plate 14 is exposed from the insulating resin portion 5. As an exposing method, paste-shaped resin such as epoxy resin is printed by screen printing using a metal mask, for example. In this case, a chamber can be filled with the resin in a good condition by placing a master board 71 in the chamber and printing the resin in a vacuum state to inhibit bubbles from being generated. Thereafter, the resin is cured by heating at 150° C. for one hour, for example, to form the insulating resin portion 5.

At this time, the insulating resin portion 5 is formed such that the height position of the upper surface of the insulating resin section 5 is equal to the height position of the upper surface of the electronic component 3 with a shielding function, as shown in FIG. 2. By forming the insulating resin portion 5 in such a way, the whole of the upper surface of the metal plate 14 is exposed from the insulating resin portion 5, and a conductive layer 6 formed in the subsequent process D is made to adhere to the exposed portion. Therefore, the conductive layer 6 can be more reliably held at a reference potential.

(Process D)

Then, the conductive layer 6 is formed on the upper surface of the insulating resin portion 5, as shown in FIG. 28(*d*). The conductive layer 6 is composed of a metal sintered layer obtained by sintering metallic fine particles, and is formed by dispersing Ag particles having an average particle diameter of 1 nm to 100 nm in an organic-based dispersion solvent such as toluene, terpineol, xylen, or tetradecane, bringing the particles into a paste, and then applying the paste to the upper surface of the insulating resin section 5. As a coating method, the paste may be applied by screen printing. Alternatively employed as the coating method may be an ink jet method for discharging a paste used for filling from a tip of a nozzle, a spin coater method for rotating at high speed the master board 71 on which a paste is dropped to form a uniform thin film, a transfer method for copying a paste printed on an elastic member such as rubber, and a dipping method for dipping a paste in a tub and applying the paste.

The paste is thus applied, followed by heating at 130 to 300° C. The Ag particles on the nano order are easily sintered even at relatively low temperature, which allows heating in a normal oven or reflow furnace without requiring a special sintering furnace or the like. Furthermore, a dense metal layer can be formed without degrading the insulating resin portion 5, the semiconductor component 4, and so on by high-temperature heating. Usable as a material for the metal sintered layer include Cu, Ni, or the like in addition to Ag.

(Process E)

Then, the master board 71 affixed to a dicing tape 72 is cut by a dicing cutter 73 along each of the board regions, as shown in FIG. 28(*e*). This causes the circuit module 1 to be divided into pieces.

According to the above-mentioned method for manufacturing the circuit module, the insulating resin portion 5 and the conductive layer 6 can be collectively formed on a whole surface of the master board 71, so that the productivity can be improved more rapidly, as compared with that in a conventional method for manufacturing a circuit module in which a metal cover is provided. That is, when the metal cover is mounted, very complicated work such as a metal cover aligning step and a soldering step is required, and the work must be individually performed for the plurality of board regions, which is low in productivity. On the other hand, the manufacturing method according to the present embodiment eliminates any complicated work such as a metal cover aligning step and a soldering step, and allows the insulating resin portion 5 and the conductive layer 6 to be collectively formed for the plurality of board regions. Therefore, the productivity of the circuit module having a shielding effect can be enhanced.

Although in the above-mentioned method for manufacturing the circuit module, description was made of a case where the conductive layer 6 is made to adhere to the reference potential portion provided in the electronic component 3 with a shielding function, the same processes A to E may be also carried out in a case where the conductive layer 6 is made to adhere to the reference potential portion provided in the semiconductor component 4 (see FIG. 7) by replacing the electronic component 3 with a shielding function with the semiconductor component 4.

When a through conductor 44 is formed in the semiconductor component 4, the through conductor 44 and the conductive layer 6 can be simultaneously formed if a conductive paste for forming the through conductor 44 and a conductive paste for forming the conductive layer 6 are the same. That is, the through conductor 44 and the conductive layer 6 can be simultaneously formed by mounting the semiconductor component 4 with the through hole formed therein on the wiring board 2 in the process B and applying the paste serving as the conductive layer 6 while filling the through hole with the paste in the process D, which allows the production efficiency of the circuit module to be improved.

<Manufacturing Method 2>

A method for manufacturing the circuit module according to the above-mentioned embodiment shown in FIGS. 18 to 20 will be then described using FIGS. 29(a) to 29(e).

(Process A)

Figure 29:
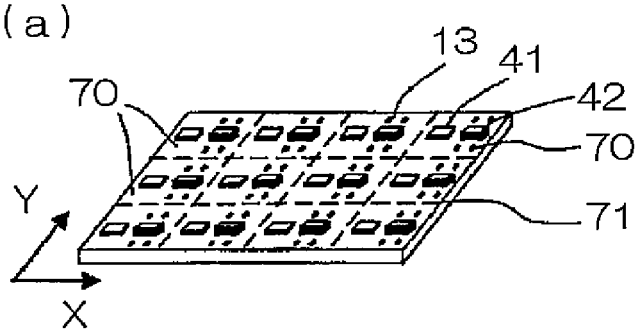
FIGS. 29(a) to 29(e) are diagrams for explaining the steps of manufacturing a circuit module according to another embodiment of the present invention.
Figure 29:
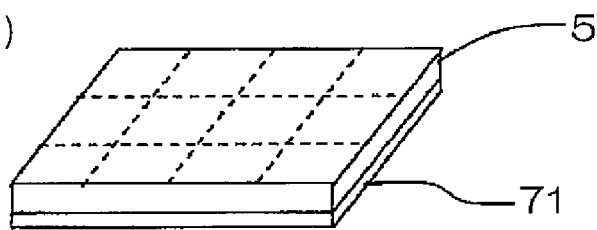
Figure 29:
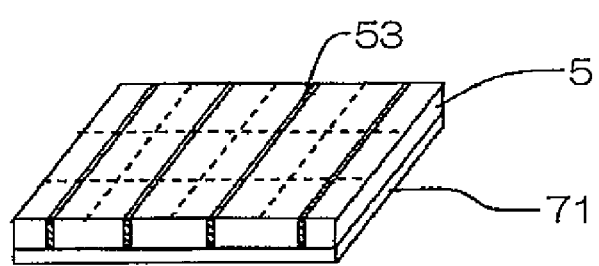
Figure 29:
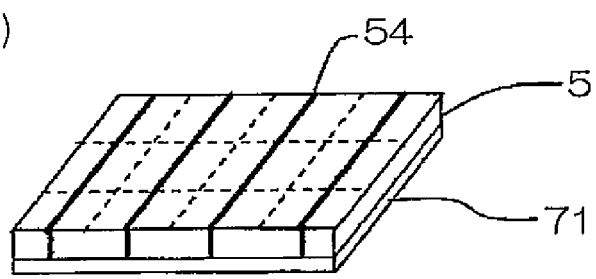
Figure 29:
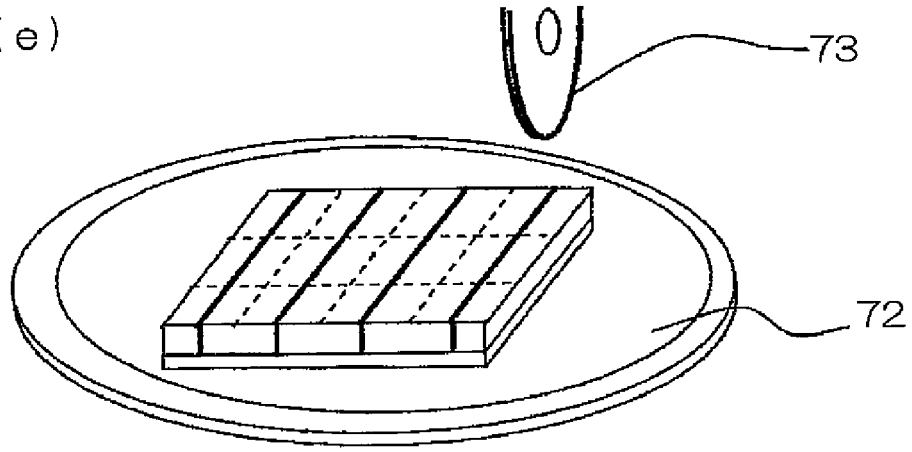
Figure 30:
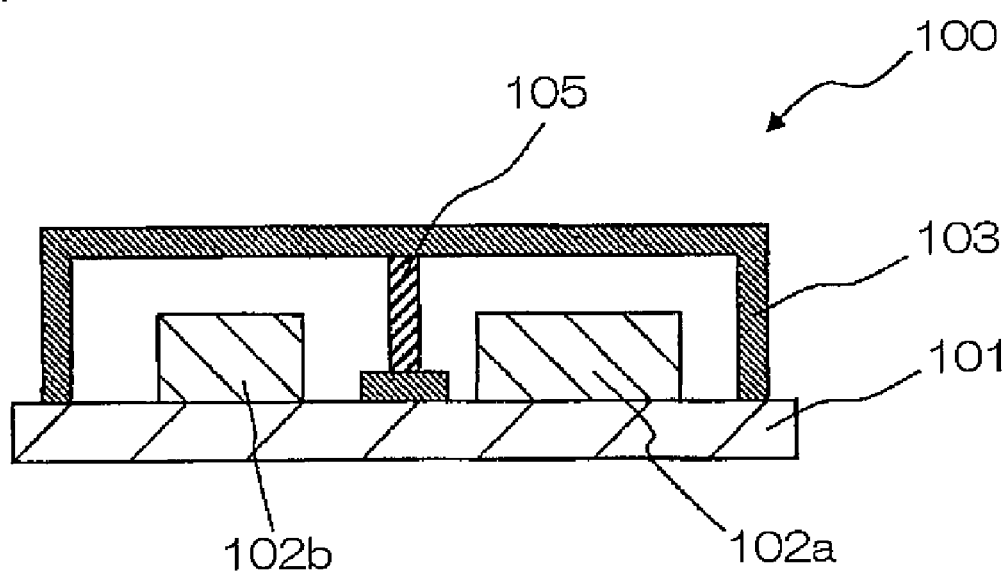
FIG. 30 is a cross-sectional view of a conventional circuit module.

First, first and second semiconductor components 41 and 42 and various electronic components 13 such as a capacitor are arranged side by side in each of a plurality of board regions 70 of a master board 71, as shown in FIG. 29(a). Note that the boundary between the adjacent board regions 70 is indicated by a dotted line for convenience.

The master board 71 is configured by laminating green sheets each composed of a ceramic material such as glass-ceramic or alumina ceramics, for example, and an electrode pad, internal wiring, a via hole conductor, an external terminal, or the like is formed on a surface of and inside of each of the board regions 70.

The master board 71 is produced by printing and applying a conductive paste serving as an electrode pad or an external terminal in a predetermined pattern on a surface of a ceramic green sheet obtained by adding and mixing a suitable organic solvent or the like to and with ceramic material powder composed of alumina ceramics or the like, laminating a plurality of ceramic green sheets, and press-molding an obtained laminate, followed by calcination at high temperature, for example.

Each of the board regions 70 is provided with an electrode pad 10, and first and second semiconductor components 41 and 42 and various electronic components 13 are mounted on the electrode pad 10 through a conductive jointing material such as a solder. Furthermore, a ground conductor 11 held at a ground potential is formed in addition to the electrode pad 10 in each of the board regions 70.

(Process B)

Then, an insulating resin portion 5 that covers the first and second semiconductor components 41 and 42 and the various electronic components 13 is formed, as shown in FIG. 29(b).

The insulating resin portion 5 prints paste-shaped resin such as epoxy resin by screen printing using a metal mask, for example. In this case, if a master board 71 is placed in a chamber, and the resin is printed in a vacuum state, bubbles are inhibited from being generated, so that the chamber can be filled with the resin in a good condition. Therefore, it is preferable that a resin printing step is carried out in a vacuum. Thereafter, the resin is cured by heating at 150° C. for one hour, for example, to form the insulating resin portion 5.

(Process C)

Then, a groove 53 that separates the first semiconductor component 41 and the second semiconductor component 42 is formed in the insulating resin portion 5 interposed between the first and second semiconductor components 41 and 42, as shown in FIG. 29(c).

The groove 53 can be formed by laser scribing using laser light, for example. However, selecting laser light having a proper output and wavelength allows an area from an upper surface of the insulating resin portion 5 to a surface of a wiring board 2 to be scribed, allowing a ground conductor 11 provided on an upper surface of the wiring board 2 to be exposed.

If the board regions 70 are previously arranged in a matrix shape in an X-direction and a Y-direction and the first and second semiconductor components 41 and 42 are arranged along the X-direction in the process A, and the groove 53 is formed so as to be connected between the adjacent board regions along the Y-direction in the process C, a shielding member 54 is formed, described later, collectively for the plurality of board regions 70, which allows the productivity of the circuit module to be improved.

(Process D)

Then, the groove 53 is filled with a conductive paste, followed by curing, to form the shielding member 54, as shown in FIG. 29(d).

The conductive paste is formed by being coated and filled with metal nano particles having an average particle diameter of 1 nm to 100 nm, followed by sintering at a low temperate of 130° C. to 300° C. More specifically, the conductive paste is formed by dispersing Ag particles having an average particle diameter of 1 nm to 100 nm in an organic-based dispersion solvent such as toluene, terpineol, xylen, or tetradecane, bringing the particles into a paste, and then filling the groove 53 with the paste. In order to fill the groove 53 with the conductive paste, a vacuum printing method can be applied. Thereafter, the metal nano particles are sintered by heating at a low temperature of 130° C. to 250° C. in an oven or a reflow furnace.

In the process D, the conductive paste may be also applied to the upper surface of the insulating resin portion 5, followed by curing, at the same time that the groove 53 is filled with the conductive paste. This allows a shielding layer held at a ground potential to be simply and reliably formed.

Thereafter, the master board 71 affixed to a dicing tape 72 is cut using a dicing cutter 73, as shown in FIG. 29(e). At this time, the master board 71 is cut in a matrix shape in length and breadth along a boundary line between the wiring boards 2 respectively having components mounted thereon.

In the above-mentioned method for manufacturing the circuit module according to the present embodiment, the shielding member 54 can be formed by only filling the groove 53 provided so as to separate the first and second semiconductor components 41 and 42 with the conductive paste, and the shielding member 54 having an electromagnetic shielding function can be formed at a position that separates the first and second semiconductor components 41 and 42 simply and more reliably.

Furthermore, only forming the groove 53 such that the ground conductor 11 is exposed allows the shielding member 54 conducted to the ground potential to be formed, which is high in production efficiency.

The present invention is not limited to the above-mentioned embodiments. For example, various modifications and improvements are possible without departing from the scope of the present invention.

The invention claimed is:

1. A circuit module comprising:
    a wiring board;
    a plurality of electronic components that are mounted on the wiring board;
    a reference potential portion that is provided on an upper surface of at least one of the plurality of electronic components;
    an insulating resin portion that covers the plurality of electronic components, excluding the reference potential portion; and
    a conductive layer that is connected to the reference potential portion and covers an upper surface of the insulating resin portion, wherein at least one electronic component having the reference potential portion includes a metal plate fixed to its upper surface, and the conductive layer is connected to the metal plate, wherein the electronic component having the reference potential portion includes a container, the metal plate fixed to an upper surface of the container, a piezoelectric vibration element contained in the container, and wherein the metal plate is connected to the ground terminal through wiring of the container.

2. The circuit module according to claim 1, wherein the height of at least one of the electronic components that is provided with the reference potential portion is more than the respective heights of the other electronic components.

3. The circuit module according to claim 2, wherein the height of the upper surface of the insulating resin portion and the height of the electronic component having the reference potential portion are equal to each other.

4. The circuit module according to claim 1, wherein the conductive layer adheres to a side surface of the metal plate, and the height of an upper surface of the conductive layer and the height of the electronic component having the reference potential portion are equal to each other.

5. The circuit module according to claim 1, wherein the conductive layer is formed of a metal sintered layer formed by heating an organic solvent including metal particles having an average particle diameter of 1 nm to 100 nm.

6. A circuit module comprising:
a wiring board;
a plurality of electronic components that are mounted on the wiring board;
a reference potential portion that is provided on an upper surface of at least one of the plurality of electronic components;
an insulating resin portion that covers the plurality of electronic components, excluding the reference potential portion; and
a conductive layer that is connected to the reference potential portion and covers an upper surface of the insulating resin portion,
wherein at least one of the electronic components that is provided with the reference potential portion is a semiconductor component including a semiconductor board, a through conductor that penetrates the semiconductor board in the thickness direction, and an electrode pad for a reference potential formed on a lower surface of the semiconductor board and electrically connected to the through conductor, and the reference potential portion is a portion, which is led out to an upper surface of the semiconductor board, of the through conductor.

7. The circuit module according to claim 6, wherein the height of the semiconductor component is more than the respective heights of the other electronic components.

8. The circuit module according to claim 7, wherein the height of the upper surface of the insulating resin portion and the height of the semiconductor component are equal to each other.

9. The circuit module according to claim 6, wherein the conductive layer is formed of a metal sintered layer formed by heating an organic solvent including metal particles having an average particle diameter of 1 nm to 100 nm.

10. A circuit module comprising:
a wiring board;
a plurality of electronic components that are mounted on the wiring board;
a reference potential portion that is provided on an upper surface of at least one of the plurality of electronic components;
an insulating resin portion that covers the plurality of electronic components, excluding the reference potential portion; and
a conductive layer that is connected to the reference potential portion and covers an upper surface of the insulating resin portion,
wherein the plurality of electronic components include a first semiconductor component and a second semiconductor component, the insulating resin portion positioned between the first semiconductor component and the second semiconductor component is provided with a groove that separates both the semiconductor components, a shielding member composed of a conductive material is buried in the groove, and the shielding member is electrically connected to the conductive layer.

11. The circuit module according to claim 10, wherein the first semiconductor component is an RFIC, and the second semiconductor component is a baseband IC.

12. The circuit module according to claim 11, further comprising an electronic component for RF electrically connected to the RFIC, wherein the electronic component for RF is arranged in one, where the RFIC is disposed, of two regions separated by the shielding member.

13. The circuit module according to claim 11, wherein a bottom surface of the groove is positioned within the wiring board, and a passive component for RF is contained in the wiring board.

14. The circuit module according to claim 10, wherein the conductive layer and the shielding member are composed of the same material.

* * * * *